United States Patent [19]

Ohta et al.

[11] Patent Number: 4,855,013

[45] Date of Patent: Aug. 8, 1989

[54] METHOD FOR CONTROLLING THE THICKNESS OF A THIN CRYSTAL FILM

[75] Inventors: Kimihiro Ohta, Kashiwa; Tadashi Nakagawa, Sakura; Takeshi Kojima, Kashiwa; Tsunenori Sakamoto; Naoyuki Kawai, both of Yatabe, all of Japan

[73] Assignee: Agency of Industrial Science and Technology, Tokyo, Japan

[21] Appl. No.: 92,348

[22] Filed: Sep. 2, 1987

Related U.S. Application Data

[63] Continuation of Ser. No. 764,595, Aug. 9, 1985, abandoned.

[30] Foreign Application Priority Data

Aug. 13, 1984 [JP]  Japan .................................. 59-169125
Aug. 13, 1984 [JP]  Japan .................................. 59-169126

[51] Int. Cl.$^4$ ............................................. C30B 25/16
[52] U.S. Cl. ............................ 156/601; 156/610; 156/611; 156/614; 156/DIG. 102; 156/DIG. 103; 156/DIG. 70; 422/108; 437/936
[58] Field of Search ............... 156/661, 610, 611, 614, 156/DIG. 70, DIG. 102, DIG. 103; 422/108; 437/936

[56] References Cited

U.S. PATENT DOCUMENTS

| | | | |
|---|---|---|---|
| 3,892,490 | 7/1975 | Uetsuki et al. | 250/560 |
| 3,906,889 | 9/1975 | Omura et al. | 118/5 |
| 3,928,092 | 12/1975 | Ballamy et al. | 156/612 |
| 4,177,094 | 12/1979 | Kroen | 156/601 |
| 4,383,872 | 5/1983 | Roberts | 156/612 |
| 4,434,025 | 2/1984 | Rubillard | 156/601 |
| 4,529,455 | 7/1985 | Bean et al. | 156/610 |
| 4,575,462 | 3/1986 | Dobson et al. | 156/610 |
| 4,636,268 | 1/1987 | Tsang | 156/DIG. 103 |

OTHER PUBLICATIONS

Neave et al. (I), Dynamics of Film Growth of GaAs by MBE from Rheed Observations, Applied Physics A, vol. 31, 1983, pp. 1 to 8.
Neave et al., (II), Dynamic Rheed Observations of the MBE Growth of GaAs, Applied Physics A, vol. 34, 1984, pp. 179 to 184.
Harris et al., Oscillations in the Surface Structure of Sn-Doped GaAs, During Growth by MBE, Surface Science 103, 1981, L90-L96.
Ploog, Molecular Beam Epitaxy of III-V Compounds, Crystals, vol. 3, III-V Semiconductors 100-102.

*Primary Examiner*—John Doll
*Assistant Examiner*—Robert M. Kunemund
*Attorney, Agent, or Firm*—Spencer & Frank

[57] ABSTRACT

A method for controlling the thickness of a thin crystal film which is grown in a vacuum atmosphere, comprising the steps of: generating an electron beam in the vacuum atmosphere; directing the electron beam thus generated to a crystal being grown to obtain a diffraction pattern of the crystal; detecting the variations in time of the intensity of the diffraction pattern thus obtained; obtaining the number of oscillations from the variations thus detected; and interrupting the growth of the crystal in synchronism with the oscillations of the intensity when the number reaches a predetermined number. The composition ratio of a mixed crystal can be also determined by the ratio among the frequency of oscillations of each crystal which constitutes the mixed crystal. The oscillations of the intensity of the RHEED pattern can be observed more than 400 times so that the thickness of the grown thin crystal film can be measured with the accuracy higher than 1000 Å in terms of the mono-layer.

9 Claims, 27 Drawing Sheets

FIG_1A
Prior Art
FIG_1B
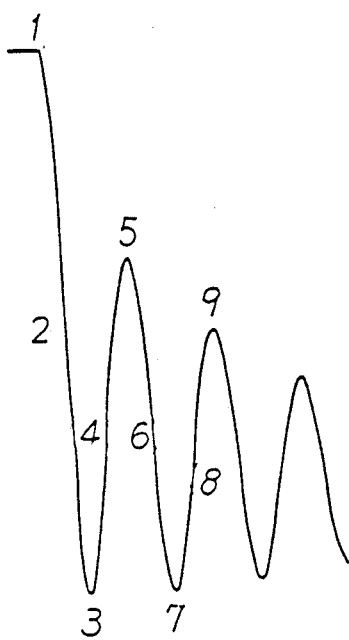
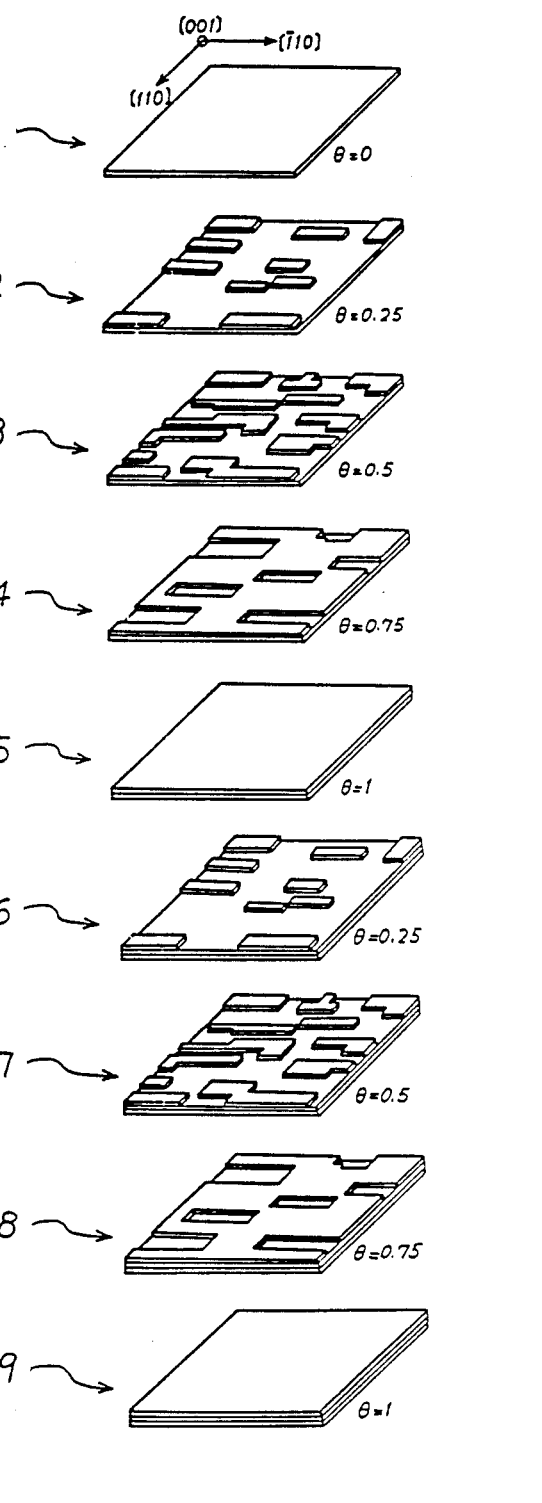

FIG_2A
*Prior Art*
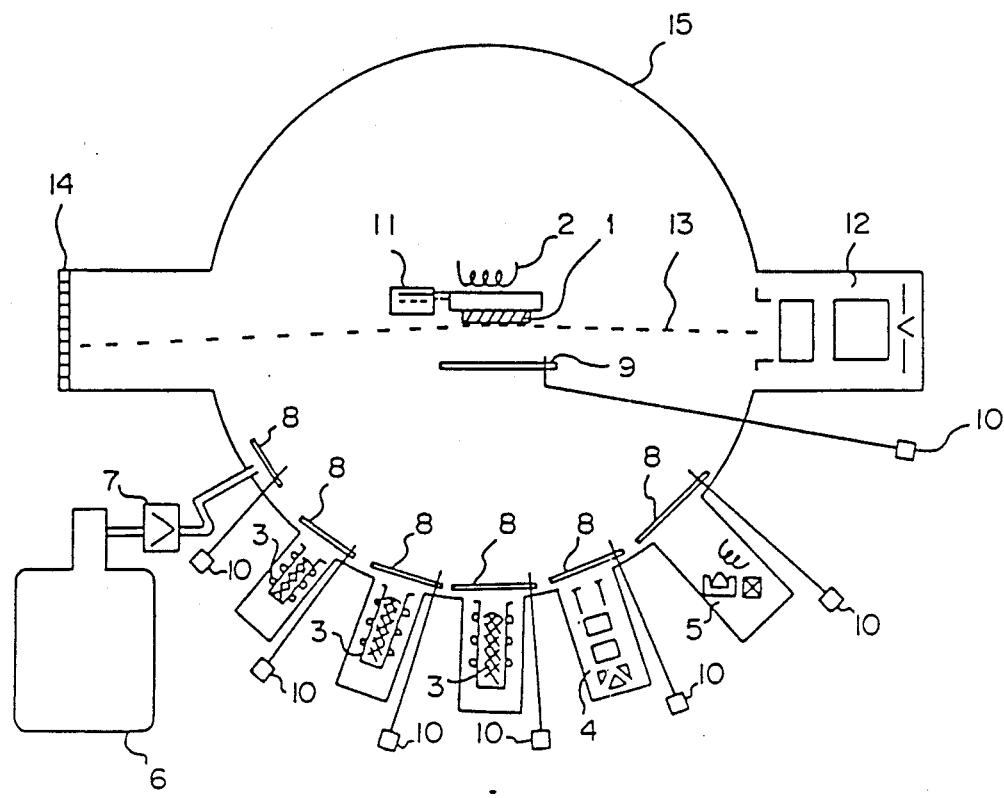

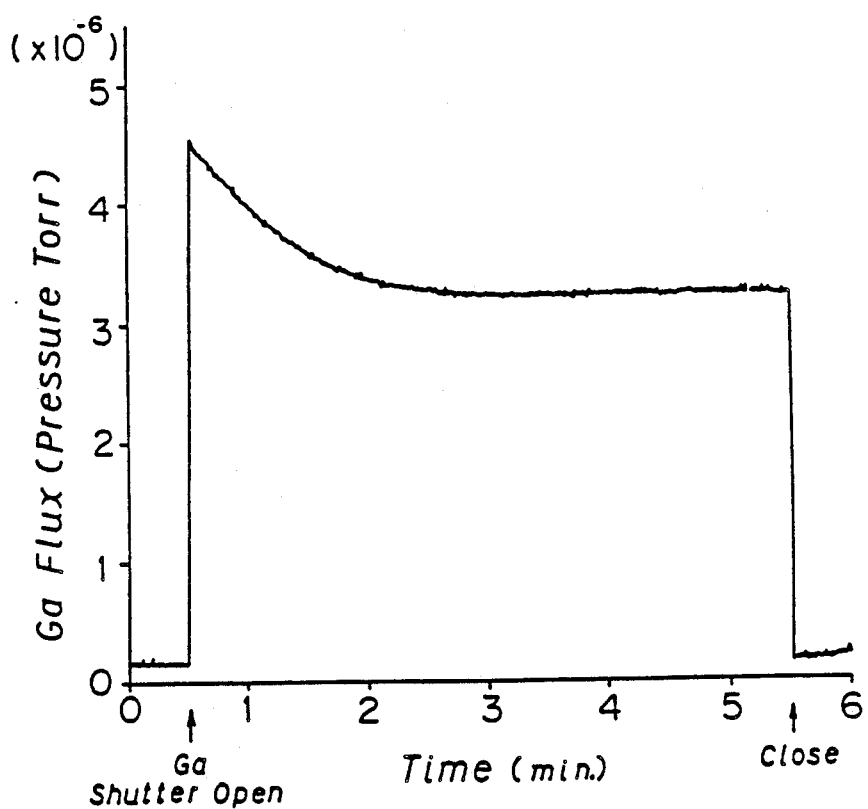
FIG_3
Prior Art

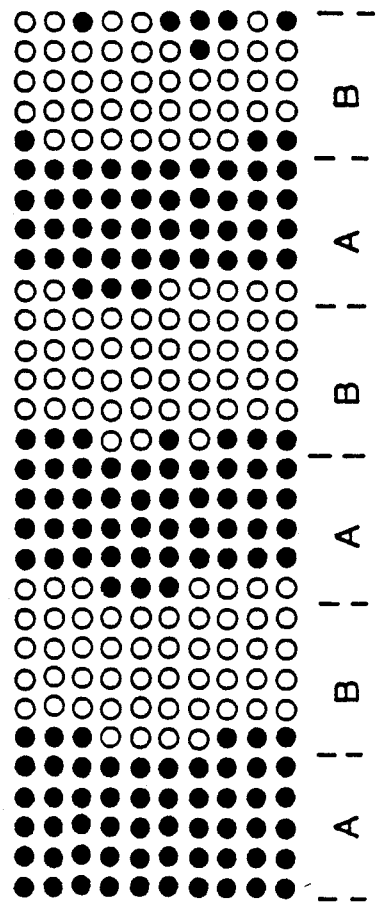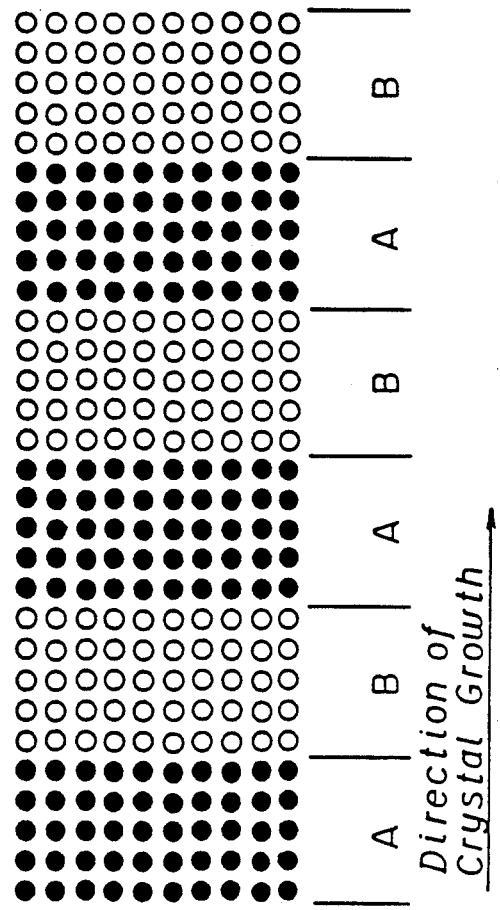
FIG_4  Prior Art
FIG_26

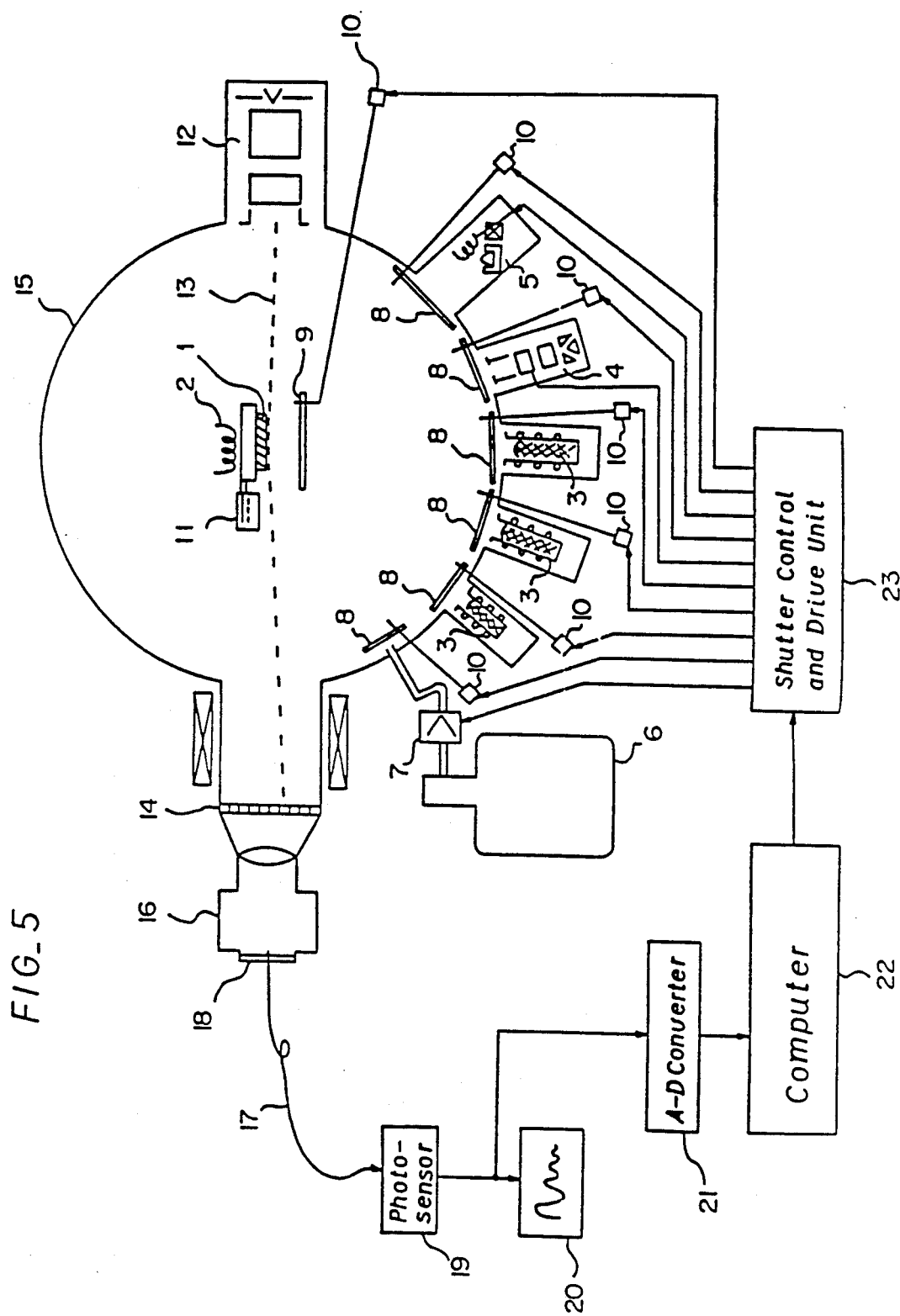
FIG_5

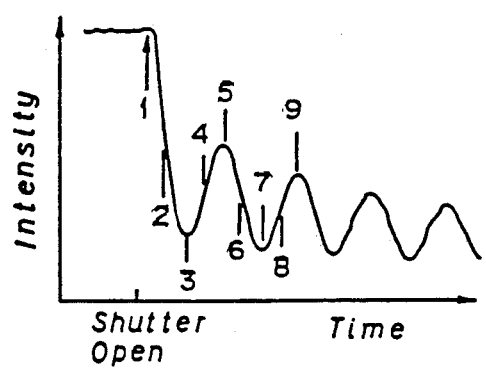
FIG_7A
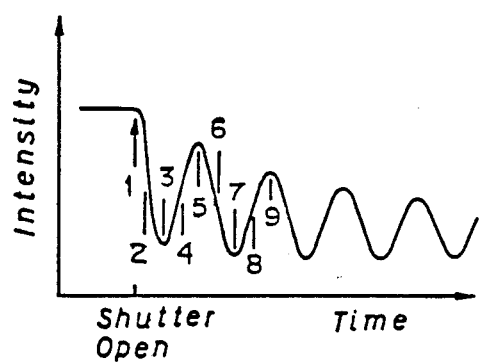
FIG_7B
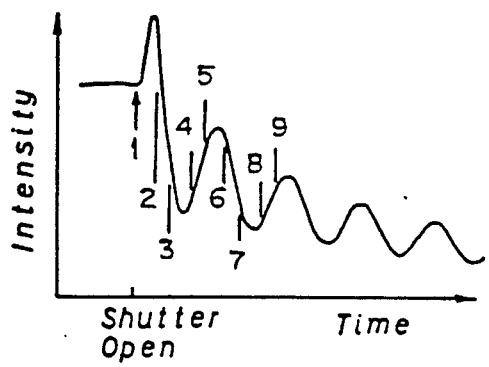
FIG_7C

FIG_7D
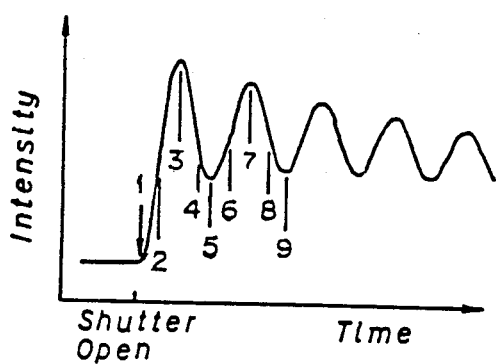
FIG_7E
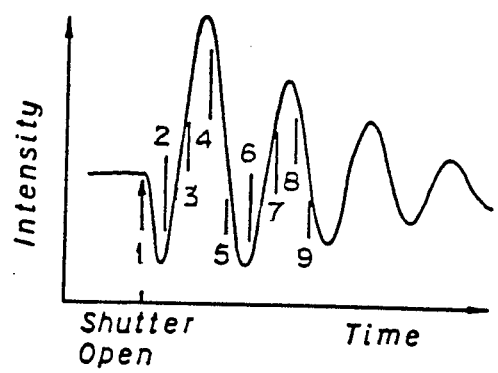

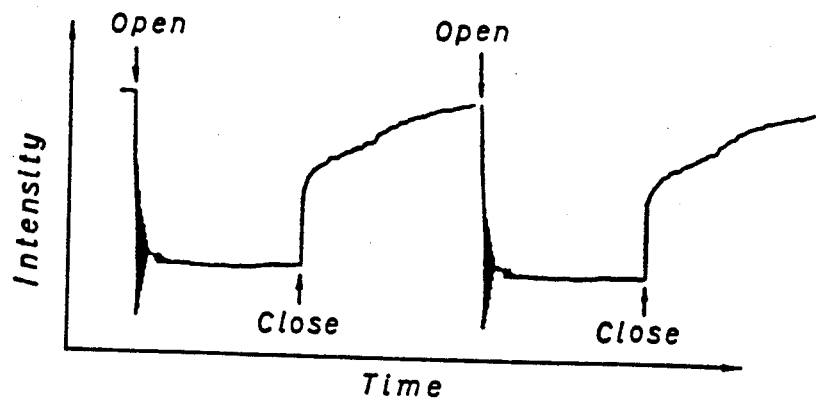
FIG_8A
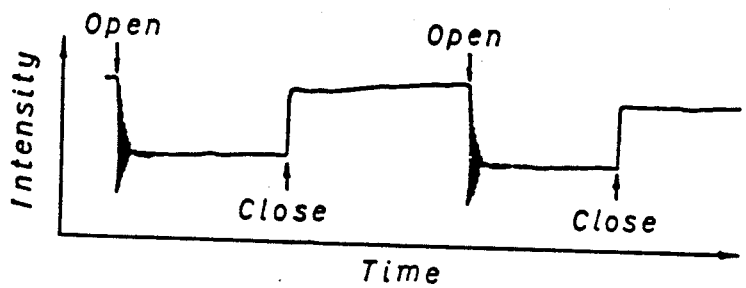
FIG_8B
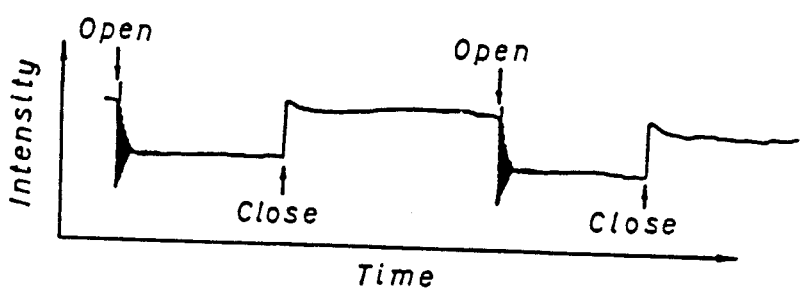
FIG_8C
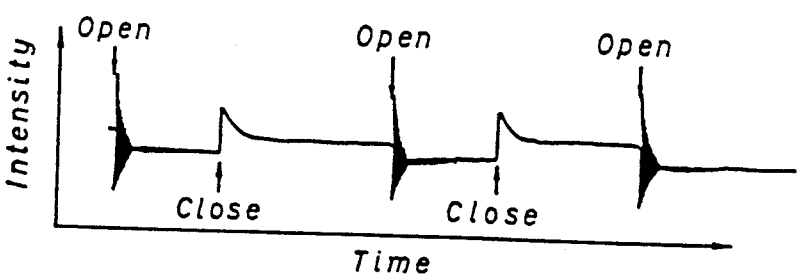
FIG_8D
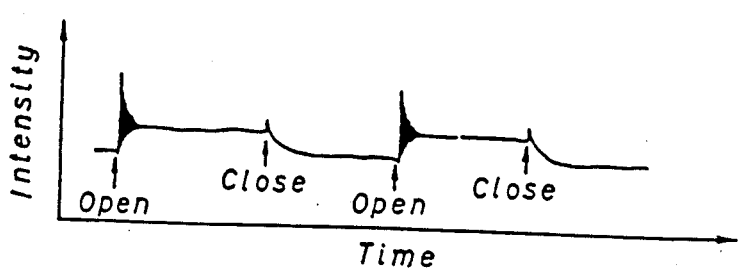
FIG_8E

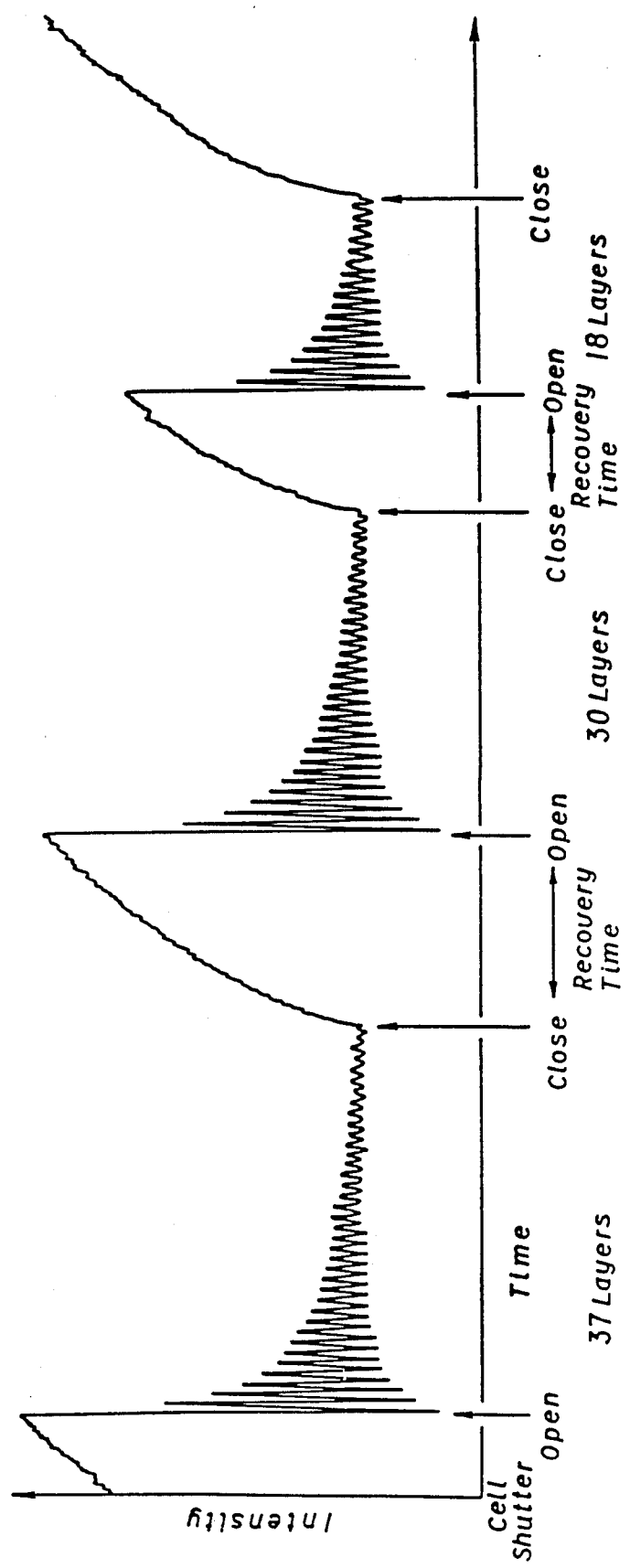
FIG_9

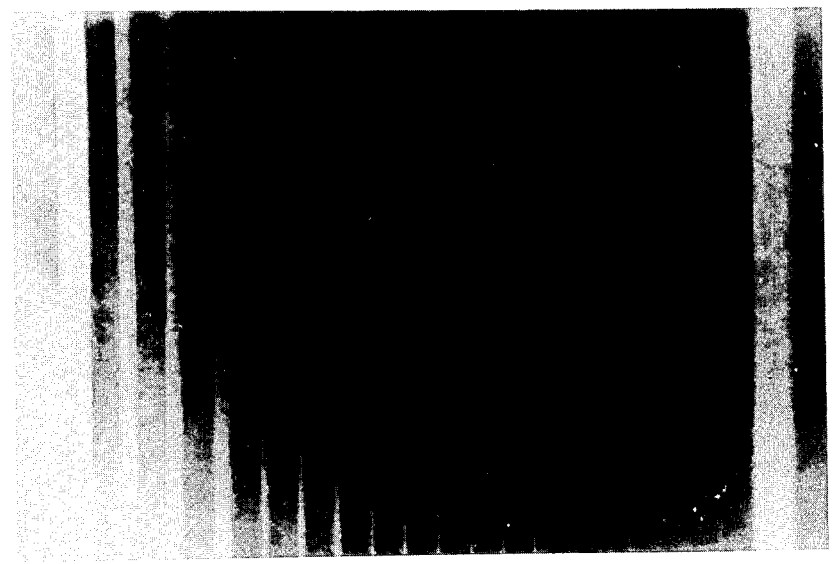
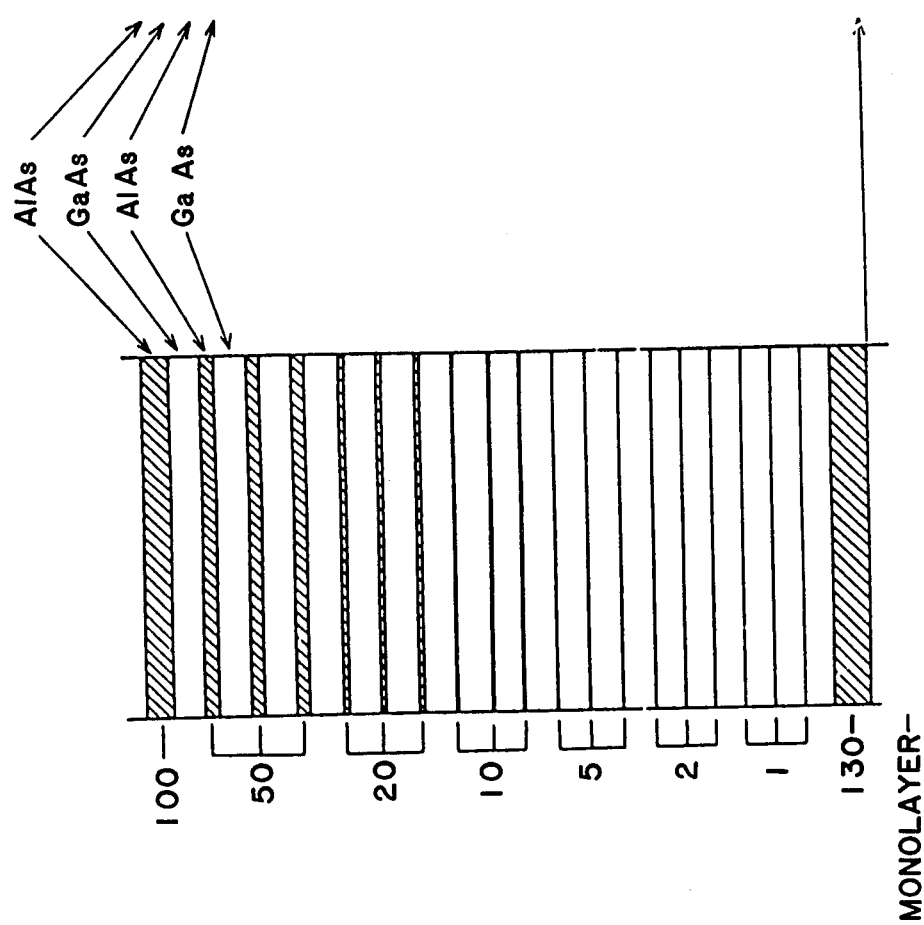
FIG._11

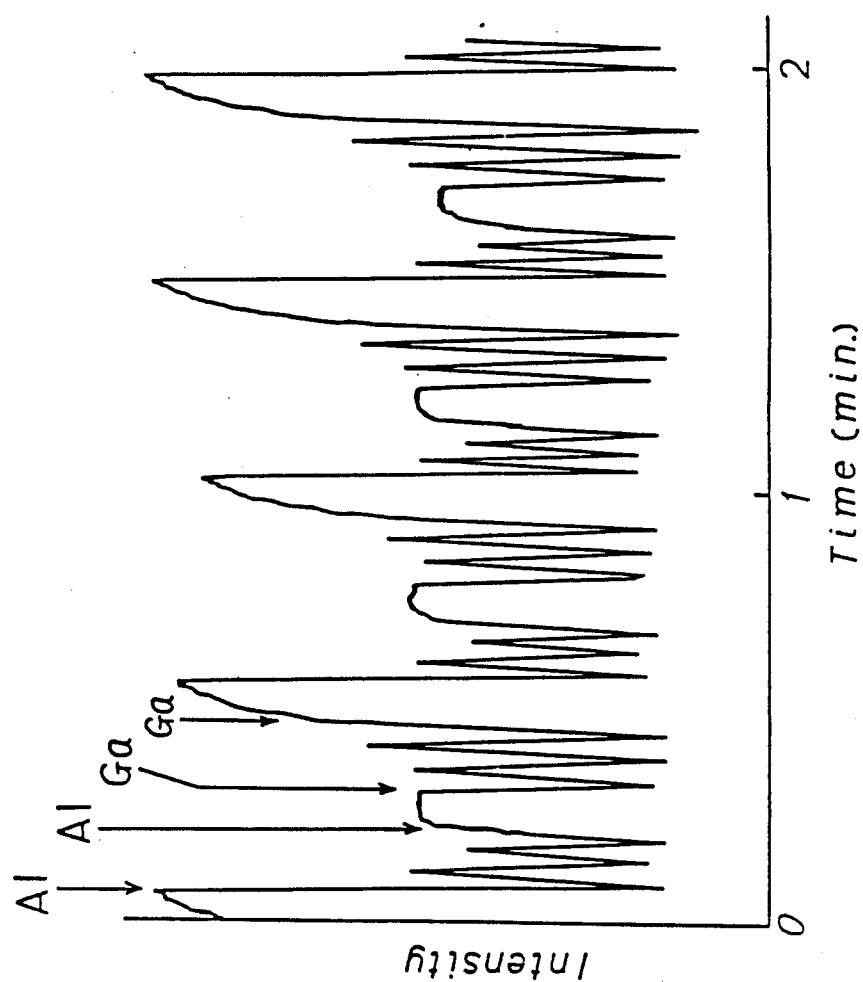
FIG_12

FIG_15

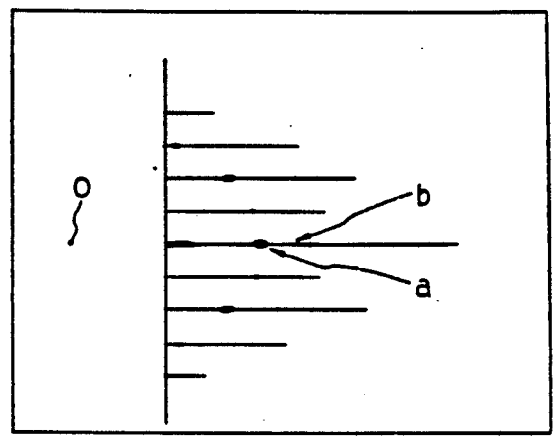
FIG_17A
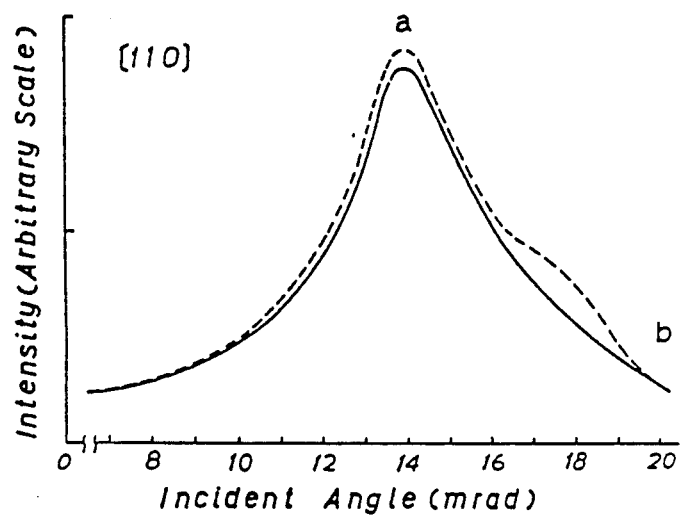
FIG_17B
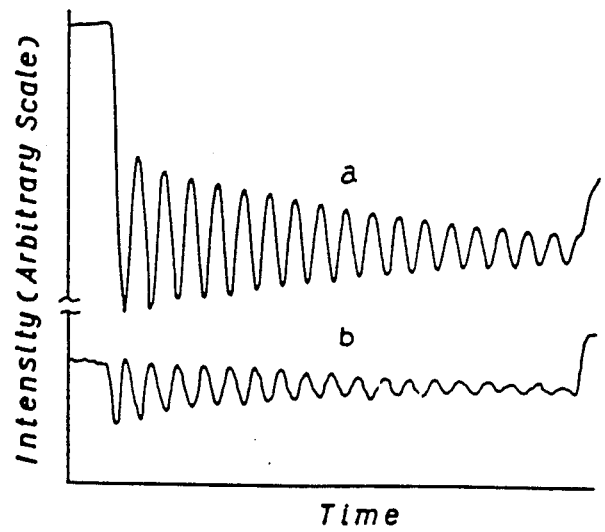
FIG_17C

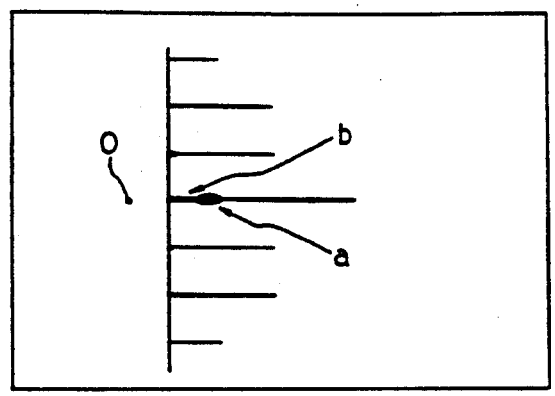
FIG_18A
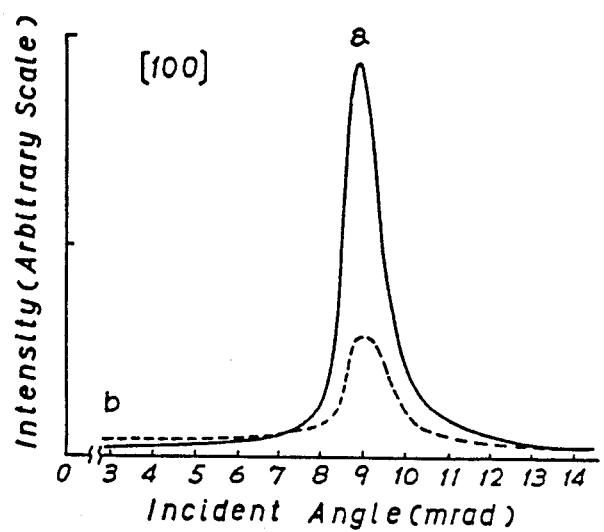
FIG_18B
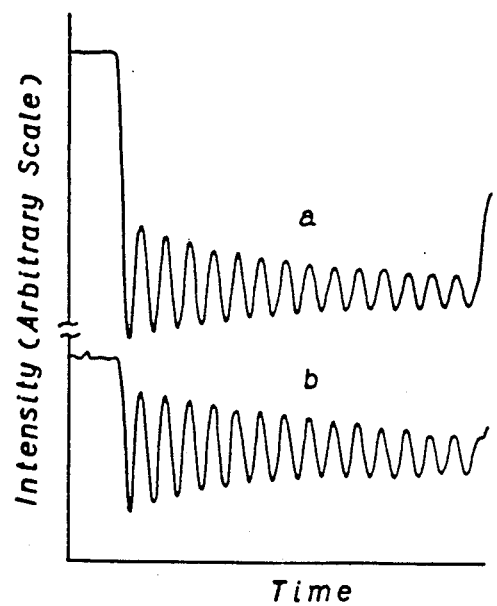
FIG_18C

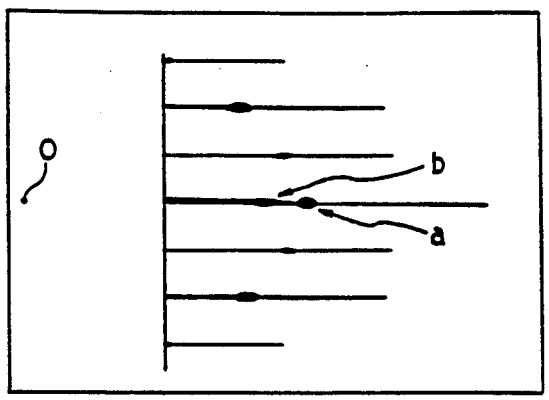
FIG_19A
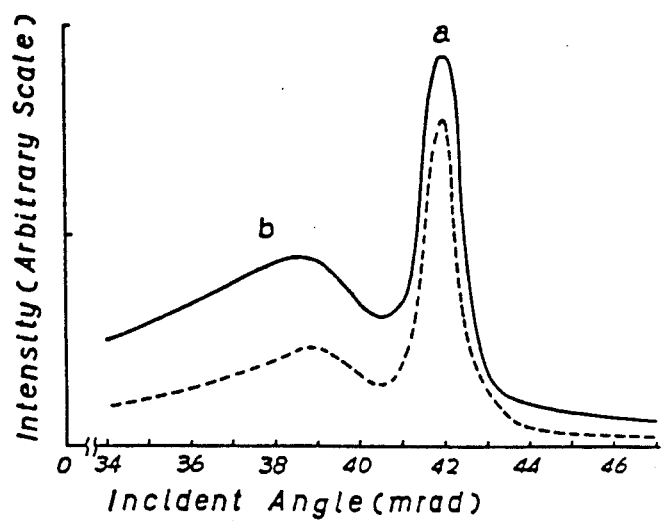
FIG_19B
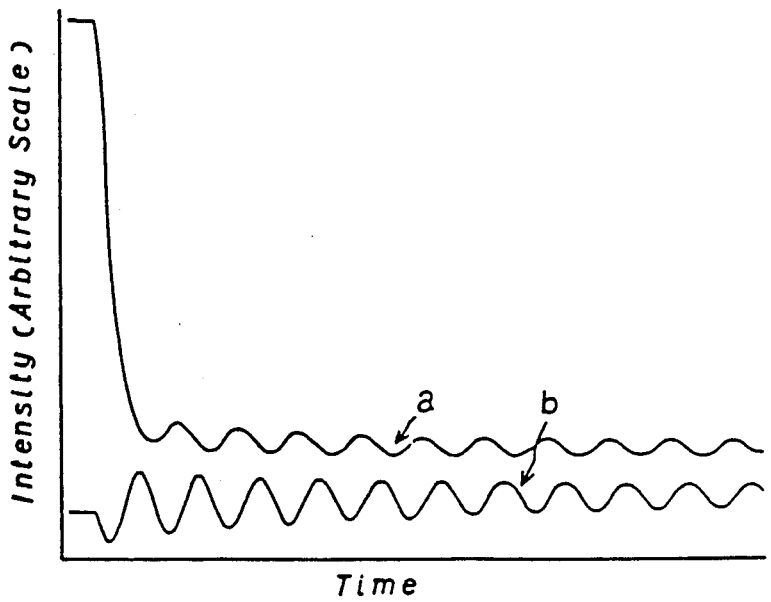
FIG_19C

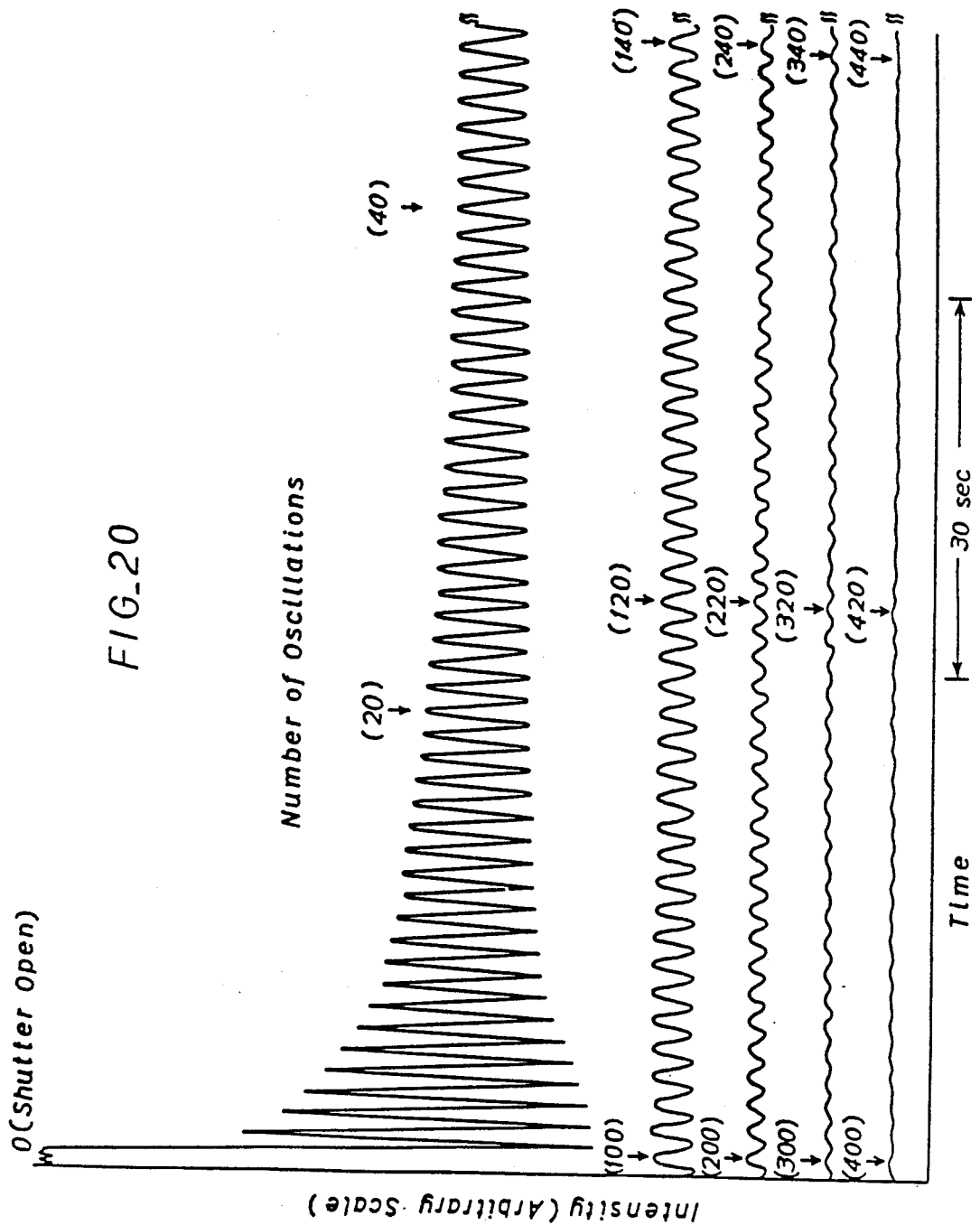

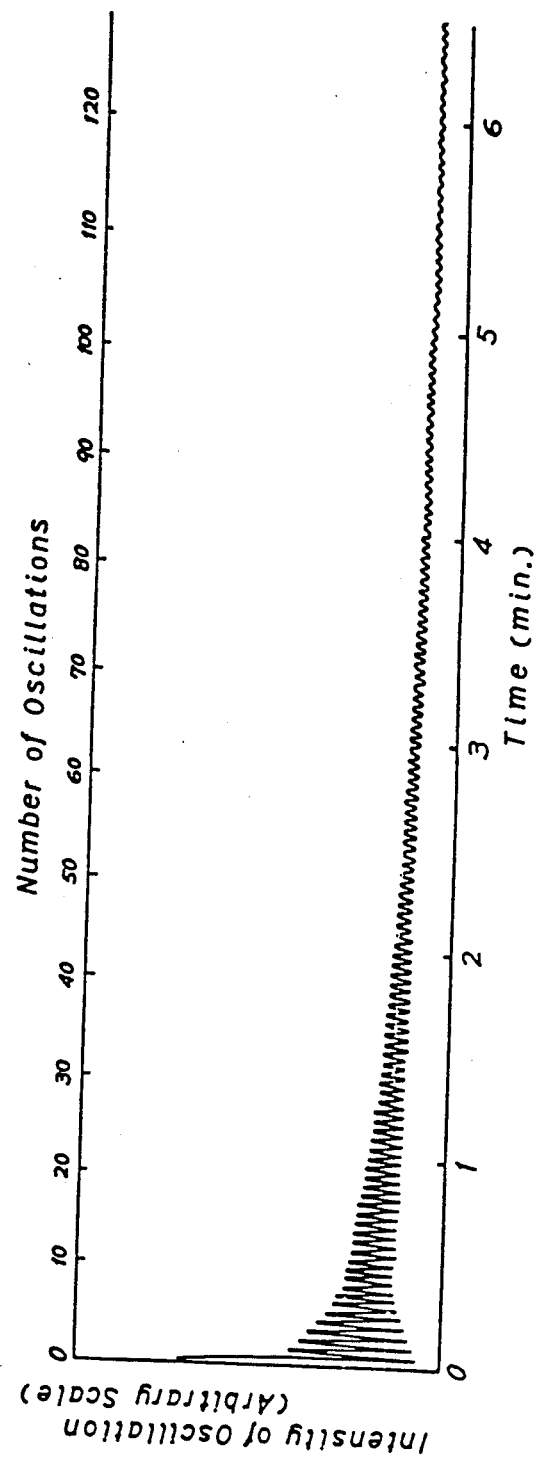

FIG_23

FIG_24

METHOD FOR CONTROLLING THE THICKNESS OF A THIN CRYSTAL FILM

This application is a continuing application of application Ser. No. 06/764,595, filed Aug. 9, 1985 now abandoned.

BACKGROUND OF THE INVENTION

1. Field of the Invention

The present invention relates to a method for controlling the thickness of a crystal film in which the thickness of a thin film which is being grown in a vacuum system is measured in terms of mono-layer unit so that the thin crystal film is grown until the desired number of mono-layers is counted layer by layer and a method for growing a standard mixed crystal having a correct composition ratio by correctly determining the composition ratio of a mixed crystal.

2. Description of the Prior Art

Of the various methods for measuring the thickness of a crystal which is being grown in a vacuum system, there is a method using a film thickness measuring instrument incorporating a quartz oscillator. In this method, the thickness of a film or layer can be measured with a higher degree of accuracy, but it is needed that the growth rate at not only the position of the quartz oscillator but also at the position of a substrate upon which a film or layer is grown must be accurately calibrated. However, this method cannot be applied to the measurement of the thickness of a film or layer of a material such as GaAs whose sticking coefficient is less than 1. In this case, the thickness of the grown layer is measured with an interference microscope or the like only after the layer of such material as described above is grown and is taken out of the vacuum system. However, even when this measuring method is used, it is still difficult to measure the thickness of a layer or film with an accuracy less than 100 Å.

As described above, it is difficult to correctly measure and control the thickness of a crystal film while the film is growing.

Meanwhile, J. J. Harris et al. of Philips Research Laboratory in England found out that when the diffraction patterns of a GaAs film grown over a GaAs substrate by a molecular beam epitaxy process under ultra-high vacuum conditions, in which the electron beam from a reflection high energy electron diffraction (RHEED) system is directed in the [110] azimuth (which includes [$\bar{1}$10], [1$\bar{1}$0] and [1$\bar{1}$0] azimuth) of the (001) GaAs substrate, are observed, the intensity of the diffraction pattern is periodically varied and one period of the intensity oscillation corresponds to the growth of one mono-layer of GaAs on the (001) plane. In this case, however, the one mono-layer consists of a complete monoatomic Ga layer and a complete monoatomic As layer and the thickness of the mono-layer is equal to one half of a lattice constant. (See Surface Science, Vol. 103, L90-L96, 1981.) It follows, therefore, that the number of mono-layers grown can be exactly measured by counting the oscillations of the intensity of the diffraction pattern.

The above-described experimental results can be appreciated as follows. FIG. 1A shows the periodic oscillations of the intensity at the specular point of a typical diffraction pattern and FIG. 1B shows a model of the surface conditions of the grown films corresponding to points ①-⑨ the oscillation shown in FIG. 1A. In FIG. 1B, $\theta$ represents a fractional layer coverage. ① shows a mirror surface condition ($\theta=0$) and ② shows $\theta=0.25$. As the coverage $\theta$ is increased, the mirror-surface-reflection intensity of the diffraction pattern is decreased and when $\theta=0.5$ as shown at ③, the intensity becomes a minimum value.

When $0.5 < \theta < 1.0$ like $\theta=0.75$ as shown the mirror-surface-reflection intensity is increased with the increased with the increase of $\theta$ and becomes a maximum value when $\theta=1$ as shown at ⑤. This tendency is repeated at the same period from ⑤ to ⑨ so that whenever one mono-layer of semiconductor thin film is grown, the intensity of the diffraction pattern oscillates once.

However, it is reported that such oscillations are damped after several tens of oscillations (J. H. Neave et al., applied Physics A31 pp. 1-8, 1983). Therefore, it is only possible to measure the thickness of a grown layer up to about 100Å in terms of the number of oscillations, so that the above-described measurement method is not satisfactory in practice in case of crystal growth for a device requiring a thicker film.

With the above in view, the thickness of a layer or film being grown is controlled by the time during which the shutter of a crystal growth apparatus is kept opened, in the case of crystal growth under vacuum conditions (which is simply referred to as "crystal growth" hereinafter in this specification), in either case where a thick or thin film is required. Furthermore, the mixed crystal composition ratio (to be referred as "the composition ratio" hereinafter in this specification) of a mixed crystal is determined by an analysis of X-ray diffraction or by other composition analizer after the crystal has been grown. This will be described in more detail with reference to the drawings.

FIG. 2A is a schematic view of a crystal growth apparatus. Reference numeral 1 denotes a crystal substrate (to be referred to as "the substrate" hereinafter in this specification); 2, a heater for heating the substrate 1; and 3, materials (to be referred to as "the source" hereinafter in this specification) required for the crystal growth. In the case of GaAs, the materials are Ga and As or dopants such as Si and Be. When the sources in the form of ions is needed, an ion gun 4 must be provided. Furthermore, when the source has a high melting point, an electron gun or sputtering apparatus must be used. Moreover, when the ions are in the form of a gas, a gas reservoir 6 and a flow-rate controller 7 are required. Each source is provided with a cell shutter (to be referred to as "shutter" hereinafter in this specification) in order to discharge or interrupt the source vapor (to be referred to as "flux" hereinafter in this specification).

Reference numeral 9 denotes a main shutter for permitting or interrupting the arrival of all source fluxes to the substrate 1. Each shutter 8 is operatively coupled to a shutter actuating device 10. Reference numeral 11 denotes a vacuum gauge or flux monitor for detecting the amount of each source flux.

Reference numeral 12 denotes a gun of a reflection high energy electron diffraction system (to be referred to as "RHEED" hereinafter in this specification) and the electrons 13 emitted from the gun 12 pass over the surface of the substrate 1 and impinges against a fluorescent screen 14 (to be referred to as "screen" hereinafter in this specification) of the RHEED. In this case, the electrons 13 are diffracted by the substrate 1 so that a diffraction pattern is displayed on the screen 14. This pattern is referred to as "RHEED pattern". An example of the pattern photograph is shown in FIG. 2B. The above-described devices and component parts are all enclosed in a vacuum chamber 15.

The process for growing a crystal on the substrate 1 will be described. First, the substrate 1 is heated at a suitable temperature by the heater 2 and then the shutters 8 of the required sources 3 and the main shutter 9 are opened. On the other hand, when the crystal growth is interrupted, the shutters 8 and the main shutter 9 are closed. In order to grow a crystal of GaAs or AlGaAs, the As flux is normally opened while the shutter for Ga or Al is opened or closed to start or terminate the crystal growth. In the case of a mixed crystal, both the shutters for Ga and for Al are simultaneously opened or closed to start or interrupt the crystal growth. Hereinafter, explanation will be made of GaAs, AlAs and AlGaAs as a mixed crystal.

So far, in order to measure the thickness of a grown crystal, Ga, Al and As fluxes are previously measured by the flux monitor 11 and then the thickness (5000Å-2 $\mu$m) of a crystal which has been grown for a long time (about one hour) with the fluxes is measured by an optical interference microscope or thin-film thickness gauge so as to prepare the calibration table of the growth rate showing the relationship between the growth rate of a thin film and a flux. Thereafter, the thickness of a grown film is estimated from the growth rate obtained from the calibration table by using only the flux value and the growth time. In order to measure the thickness of a few Å to hundreds Å which is substantially equal to the thickness of one mono-layer to ten mono-layers which can be grown within a short period of time, the thickness is also estimated from the flux value and the growth time based on the calibration table of the growth rate obtained in the manner described above by the long time growth. However, according to this method, the variation in growth rate due to the variations of flux in time immediately after the shutter is opened is not taken into consideration, and therefor it is difficult to control the thickness of a film comparable to a mono-layer.

FIG. 3 shows the variation of the Ga flux with time measured immediately after the shutter is opened.

The Ga flux varies for a few minutes after the shutter has been opened, so that during this period of time the growth rate is not constant. As a result, the prior art method for measuring the thickness of a grown film based on the calibration table of the growth rate cannot be effectively used until the time that the growth rate becomes constant. Especially, in the case of the fabrication of a device such as a superlattice, the shutter must be opened and closed within a few seconds or a few minutes, i.e., before the growth rate becomes constant, so that the thickness of the grown film cannot be measured.

FIG. 4 schematically shows an example in which two kinds of crystals A and B are alternately grown as mono-layers in the manner described above ad it is seen that the interface between the mono-layers is not flat and fluctuated.

In the case of a mixed crystal growth such as $Al_xGa_{1-x}As$, the mixed crystal composition ratio x must be determined. In order to determined the value x, the following method has been employed. First, prior to the crystal growth, the Ga, Al and As fluxes are measured by the flux monitor 11 shown in FIG. 2 and the growth rate of GaAs and the growth rate of AlAs are measured, whereby the calibration table is prepared. Thereafter, the simultaneous growth rate and the composition ratio x are obtained from the growth rates of GaAs and AlAs and after the mixed crystal growth, the lattice constant is measured by X-ray diffraction, while the composition is analyzed, so that the value which can explain any data without any contradiction is determined as the composition ratio x. The above-described prior art method for determining the composition ratio is also based on the growth rate of a crystal which has been grown for a long time. Therefore, while the flux has no constant value, the composition ratio cannot be determined.

As described above, when the growth rate which is required in the control of the thickness of a grown layer and in the determination of the composition ratio is determined, considerable difficulties are encountered in practice when the thickness of a film or layer, which is most important, is determined by the prior art based upon a long-time growth. As a result, thickness of a grown film cannot be obtained with a desired degree of accuracy. Thus, the significant figure has one or two digits. The accuracy of the thickness of a grown film and the composition ratio measured by the above-described prior art method are two digits at the most. Furthermore, in the case of the measurement of the thickness and composition of a crystal which is grown for a short period of time, the accuracy is further low. If the composition ratio can be obtained at a higher degree of accuracy in principle, a standard crystal with a predetermined composition can be obtained.

According to the prior art method for controlling the thickness of a grown film, the thickness of the grown film cannot be determined and the heterojunction interface is indefinite. Furthermore, since the composition ratio of a mixed crystal is not determined, it is difficult to fabricate a device as designed.

As a result, the laser wavelength of a quantum well laser or a multi-quantum well laser is deviated or divided into a few wavelengths so that the laser wavelength itself cannot be realized as designed. In the case of a light emitting diode, the wavelength of an emitted light is deviated from a designed value and the efficiency is degraded. In the case of HEMT (high electron mobility transistor) and a device in which the conduction of two dimensional electrons is utilized, the interface is disturbed and the potential step difference is deviated from a designed value, so that the scattering at the interface occurs and the concentration of two dimensional electrons is deviated from a designed value. As a result, high speed operation cannot be expected.

Furthermore, in the cases of vertical superlattice devices such as one barrier diodes, two-barrier diodes, CHIRP (Coherent Hetero Interfaces for Reflection and Penetration) superlattice (See U.S. Ser. No. 578,574) or the like and the superlattice gate field-effect transistors, their characteristics vary considerably one from another, because of the indefinite interface and the deviations from the designed values.

SUMMARY OF THE INVENTION

In view of the above, one of the objects of the present invention is to provide a method for controlling the thickness of a crystal film which can control with a higher degree of accuracy the growth of crystal used in quantum effect devices such as superlattice elements, high electron mobility transistors and the like in which the crystal growth must be controlled with an accuracy in terms of a mono-layer unit.

A further object of the present invention is to provide a method for controlling the thickness of a crystal film which is growing and a method for determining the composition of a mixed crystal which substantially overcome the above and other problems encountered in the prior art methods and which grow a crystal having a well controlled thickness and a well controlled composition ratio so that in the cases of quantum well lasers, multi-quantum well lasers and light emitting diodes, their wavelength can be narrowed and stabilized and their efficiencies are enhanced, in the cases of HEMTs and electron devices, high speed operation and high reliability are ensured and in the cases of superlattice elements, their characteristics are stabilized and high accuracy and high reliability are ensured.

A further object of the present invention is to provide a method for controlling a crystal film which can substantially overcome the above and other problems encountered in the prior art methods and which is capable of measuring the oscillations of the intensity of the observed diffraction pattern about ten times as much as the oscillations measured by the prior art method and capable of controlling the thickness of a thin crystal film in excesses of 1000Å with an accuracy of the order of a monolayer unit.

The inventors discovered that the above-described objects can be attained by a method in which the thickness of a thin film crystal which is being grown in a vacuum system is controlled by measuring of the number of oscillations of the periodic variations of the intensity of the diffraction pattern of electron beam, and completed the present invention.

According to one aspect of the present invention, a method for controlling the thickness of a thin crystal film which is grown in a vacuum atmosphere, comprises the steps of:

generating an electron beam in the vacuum atmosphere;

directing the electron beam thus generated to a crystal being grown to obtain a diffraction pattern of the crystal;

detecting the oscillations of the intensity of the diffraction pattern thus obtained; and obtaining the number of oscillations from the variations thus detected; and interrupting the growth of the crystal in synchronism with the oscillations when the number reaches a predetermined number.

Here, the electron beam may be generated and diffracted by a reflection electron beam diffraction apparatus. The crystal may be a semiconductor crystal having an (001) plane and the electron beam may be incident to the (001) plane in the [100], [120] or [130] azimuth direction. Here, the [100] azimuth direction can include [$\bar{1}$00], [0$\bar{1}$0] and [010] azimuth directions.

The diffraction pattern can be modulated by a frequency about ten times higher than the frequency of the oscillations.

According to a second aspect of the present invention, a method for determining the composition ratio of a mixed crystal including at least two kinds of crystals being grown in a vacuum atmosphere comprises the steps of:

generating an electron beam in the vacuum atmosphere;

directing the electron beam thus generated to the mixed crystal to obtain a diffraction pattern of each of the crystals constituting the mixed crystal being grown;

detecting the oscillations of the intensity of the diffraction pattern thus obtained;

obtaining the frequency of the oscillations of each of the crystals constituting the mixed crystal and the frequency of the oscillations of the mixed crystal from the variations thus detected; and calculating the composition ratio of the mixed crystal from the ratio among the frequencies of oscillations.

Here, the electron beam may be generated and diffracted by a reflection electron beam diffraction apparatus. The crystal may be semiconductor crystal having (001) plane and the electron beam may be incident to the (001) plane in [100], [120] or [130] azimuth direction. Here, the direction [100] can include [100], [0$\bar{1}$0] and [010] azimuth directions.

The diffraction pattern can be modulated by a frequency about ten times higher than the frequency of the oscillations.

The above and other objects, effects, features and advantages of the present invention will become more apparent from the following description of preferred embodiments thereof taken in conjunction with the accompanying drawings.

BRIEF DESCRIPTION OF THE DRAWINGS

FIG. 1A illustrates the oscillation of the intensity of the specular point of a diffraction pattern;

FIG. 1B shows a schematic model of the surface conditions of a crystal during growth;

FIG. 2A is a schematic view showing a prior art crystal growing apparatus;

FIG. 3 is a graph illustrating the variation time of Ga flux measured immediately after a shutter is opened;

FIG. 4 is a schematic view showing the arrangements of mono-layers when two kinds of crystals are alternately grown by the prior art method;

FIG. 5 is a schematic view showing a crystal growth apparatus used to embody the present invention;

FIGS. 7A-7E are measured waveform diagrams showing the oscillations of the intensity at the specular point of the diffraction patterns when the initial phases are different;

FIGS. 8A-8E are waveform diagrams showing the measured RHEED oscillations with various initial phases after enough recovery time in the processes of crystal growth;

FIG. 9 is a waveform diagram illustrating one example of the oscillation of the RHEED intensity in the process of crystal growth;

FIG. 11 shows a TEM photograph and its diagram with a hetero-multi-layer structure in which the GaAs layer consists of a constant one hundred mono-layers and the AlAs layers were grown by gradually changing from one mono-layer to 130 mono-layers;

FIG. 12 is a waveform diagram illustrating the oscillation when a superlattice structure consisting of three GaAs mono-layers and three AlAs mono-layers was fabricated by controlling the shutters by monitoring the intensity oscillation of the reflection high energy electron diffraction pattern;

FIG. 17A illustrates the diffraction pattern in the direction [110] azimuth on the (001) GaAs substrate when the angle of incidence was 14 mrad;

FIG. 17B illustrates the characteristics of the intensity distribution adjacent to a-b in FIG. 17A;

FIG. 17C illustrates waveforms illustrating the variations in time of oscillations at points a and b in FIG. 17A;

FIG. 18A illustrates the diffraction pattern in the direction [100] azimuth on the (001) GaAs substrate when the angle of incidence was 9 mrad;

FIG. 18B illustrates the characteristics of the intensity distribution adjacent to a-b in FIG. 18A;

FIG. 18C illustrates waveforms illustrating the variations in time of oscillations at points a and b in FIG. 18A;

FIG. 19A illustrates the diffraction pattern in the direction [100] azimuth on the (001) GaAs substrate when the angle of incidence was 42 mrad;

FIG. 19B illustrates the characteristics of the intensity distribution adjacent to a-b in FIG. 19A;

FIG. 19C illustrates the waveforms illustrating the variations in time of oscillations at points a and b in FIG. 19A;

FIG. 20 is a waveform diagram illustrating the variations in time of the amplitude of the intensity at the specular point in the diffraction pattern obtained when the electron beam is incident in the direction [100] azimuth during the growth of a (001) $Al_xGa_{1-x}As$ (x=0.61) film in one embodiment of the present invention;

FIG. 21 is a waveform diagram illustrating the variations in time of the amplitude of the intensity at the specular point in the diffraction pattern in the direction [120] azimuth obtained when GaAs was grown on the (001) GaAs substrate;

FIG. 26 is a schematic view showing the arrangements of mono-layers when two kinds of crystals are alternately grown in accordance with the present invention.

DETAILED DESCRIPTION OF PREFERRED EMBODIMENTS

Figure 2B:
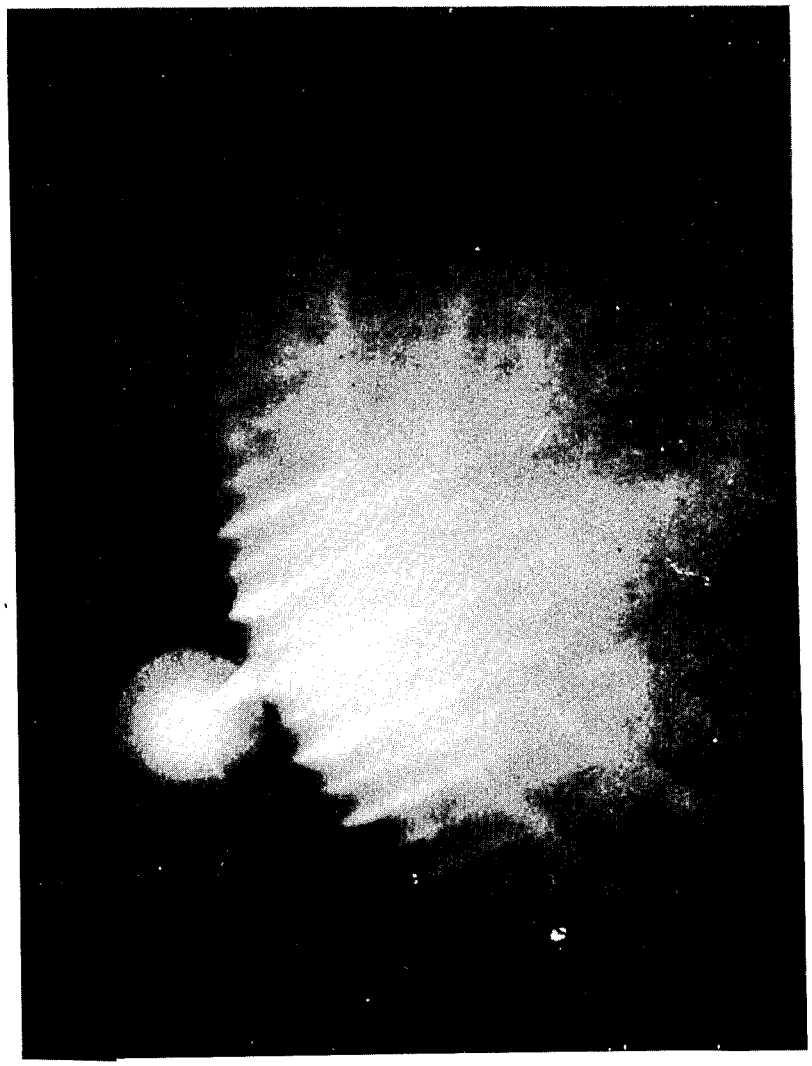
FIG. 2B is a photograph of a RHEED pattern.

FIG. 5 shows schematically a crystal growth apparatus used to carry out the present invention. The same reference numerals are used to designate similar parts in FIG. 2 and no detailed explanation of these parts will be made.

In FIG. 5, reference numeral 16 represents a camera lens; 17, an optical fiber; 18, an X-Y stage for displacing the optical fiber 17 in the X and Y directions; 19, a photosensor; 20, a recorder; 21, an A-D converter; 22, a computer; and 23, a shutter control and drive unit.

The RHEED pattern displayed on the screen 14 is focused through the camera lens 16 on the X-Y stage 18 and light from a suitable point of the image thus focused is transmitted through the optical fiber 17 to the photosensor 19. The output signal from the photosensor 19 is applied through the A-D converter 21 to the computer 22. Meanwhile, the output from the photosensor 19 is applied to the recorder 20, so that the output can be monitored. In response to the instruction signal from the computer 22, the shutter control and drive unit 23 is activated, so that the respective source shutters 10, the main shutter 9, the extraction voltage of the ion gun 4, the gas flow rate and the electron current of the electron gun 5 can be suitably controlled.

Figure 6A:
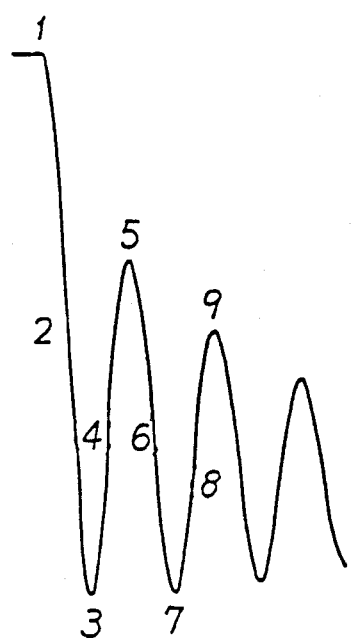
FIG. 6A is a waveform diagram showing the oscillation of the intensity at the specular point of RHEED pattern.

FIG. 6A shows an example of the intensity oscillations at the reflection point in the RHEED pattern (to be referred to as "specular" hereinafter in this specification). The specular is especially strongest in intensity of a RHEED pattern. The intensity was recorded by the recorder immediately after the crystal growth. Since a GaAs crystal was being grown, the time point at which the crystal growth was started by opening the Ga source shutter is indicated by ①. From this time point, the specular intensity oscillates as indicated by ②-⑨. The oscillations also occur at the points other than the specular.

Figure 6B:
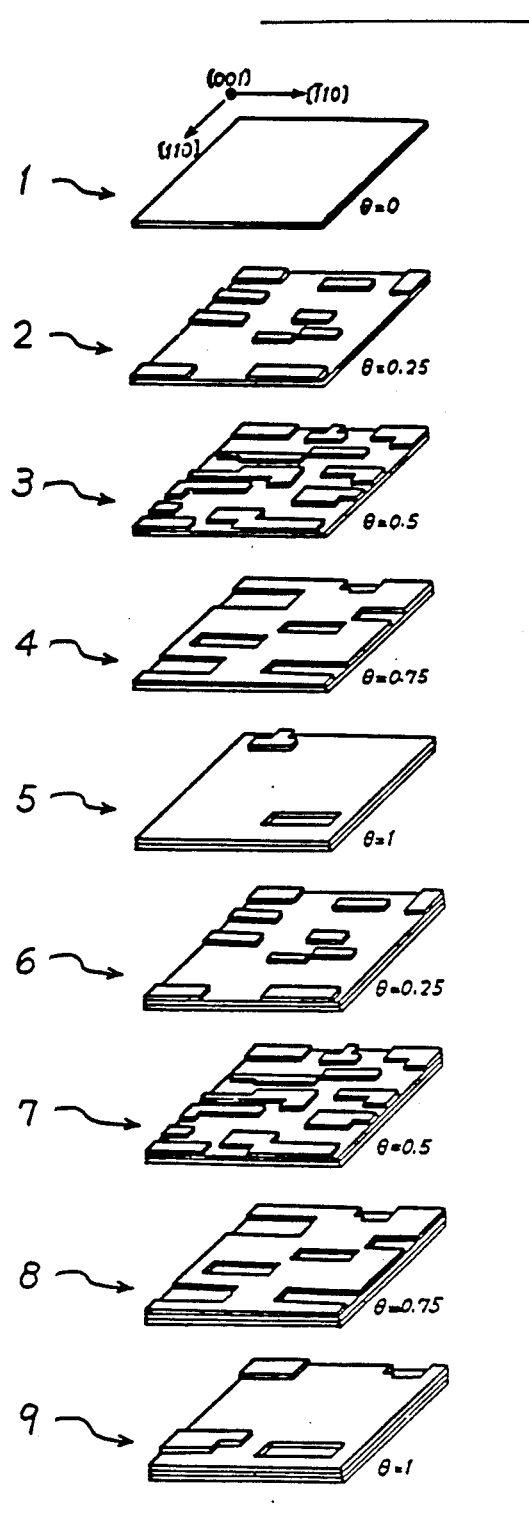
FIG. 6B is a schematic model of the surface conditions of a crystal film during growth corresponding to the oscillation shown in FIG. 6A.

It is now considered that the RHEED pattern oscillates and damps because of the crystal growth mechanism as shown in FIG. 6B. That is, as the crystal grows, island-like fine crystals are expanded in a dot-like manner over the surface of the substrate and the surface roughness reaches a maximum when the coverage $\theta=0.5$ as shown at ③. The crystal growth further proceeds, so that the growth of one layer is completed as shown at ⑤. In this condition, almost all of the surface of the substrate is covered with the one grown layer, so that the surface of the substrate becomes clean and flat again. Then, the above-described process is repeated, so that the intensity of the RHEED pattern oscillates. It is considered that the reason why the oscillation damps is that the subsequent layer nucleates prior to the complete formation of the present layer. It is further known in the art that the oscillation frequency is in proportion to the crystal growth rate.

As will be described in more detail hereinafter, the present inventors found out the fact that one period of the oscillation of the RHEED pattern exactly corresponds to one mono-layer. The preset invention was made based upon the recognition of the fact that one period of the RHEED pattern corresponds to one mono-layer. It follows, therefore, that from time point ① to time point ⑤ of mono-layer is grown and in like manner from time point ⑤ to time point ⑨ one mono-layer is further grown. Therefore, it can be judged which mono-layer in ordinal number is going to grow by counting the number of oscillations immediately after the crystal growth starts. In the cases of GaAs and AlAs crystals, a pair of Ga and As monoatomic layers form one mono-layer and a pair of Al and As monoatomic layers form one mono-layer. In the case of a mixed crystal such as $Al_xGa_{l-x}As$, a pair of $(AlAs)_x$ and $(GaAs)_{1-x}$ form one mono-layer.

The initial phase of the oscillation when the oscillation of the RHEED intensity starts is dependent upon the measured position in the RHEED pattern, the crystal orientation, the angle of incidence of the electron beam, the azimuth direction of incidence of the electron beam, the temperature of the substrate and the intensity of the As flux. As a result, it is extremely difficult at present to control exactly the initial phase. However, the reproducibility of the initial phase in a fixed condition is good.

FIGS. 7A-7E show experimental results of the variations in initial phase. Of the numerals ①-⑨ shown in FIGS. 7A-7E, and regardless of the initial phase at which the oscillation starts, ①-⑤ correspond to one mono-layer and ⑤-⑨ correspond to the next mono-layer. Therefore, in FIG. 5, the output signal from the photosensor 19 is applied through the A-D converter 21 to the computer 22, so that the mode of oscillations of the RHEED intensity is observed from the time point at which the crystal growth starts, and the computer 22 by means of an appropriate programming software, can judge in which number of mono-layers and at what phase point the crystal is growing. Therefore, in FIGS. 7A-7E, the computer 22 under an appropriate programming software can supply a control signal to the shutter control and drive unit 23 so that the crystal growth can be interrupted at the phase corresponding to ⑤ or ⑨ which are matched with the initial phase ①. In response to the control signal from the computer 22, the shutter control and drive unit 23 actuates the shutter driving devices 10. In addition, the shutter control and drive unit 23 can control the gas flow-rate controller 7, the extracting voltage of the ion gun 4 and the electron current of the electron gun 5, so that the crystal growth can be interrupted. In the manner described above, the crystal growth can be interrupted when a desired number of mono-layers are formed.

As shown in FIGS. 6A and 6B and FIGS. 7A-7E, the oscillation of the RHEED intensity is damped, so that no oscillation can be observed after a long period of time, and accordingly the number of mono-layers cannot be measured. However, even if the oscillations of the RHEED intensity having various initial phases are damped after a long period of time of the crystal growth, the oscillations can be observed again whenever the shutters are closed to interrupt the crystal growth for a suitable period of time and then opened again to start the crystal growth as shown in FIGS. 8A-8E. The suitable period of time between closing and re-opening of the shutters is regarded as the recovery time. In this case, if the recovery time is short, the amplitude of the restarted oscillations is small. On the other hand, when the recovery time is sufficiently long, oscillations with the same amplitude as the initial oscillation are started again. In FIGS. 8A-8E, the oscillations occur in the black portions.

FIG. 9 shows a further embodiment of the present invention in which the growth of GaAs is interrupted before the oscillation is completely damped and then the growth is restarted accompanied with the oscillation after a suitable recovery time. 37 GaAs mono-layers are first grown then 30 GaAs mono-layers are grown thereover, and finally 18 GaAs mono-layers are grown thereover. Therefore, 85 layers in total are grown and the thickness of the film is 240.55Å. The thickness of one mono-layer is calculated from the lattice constant $a_0$ of GaAs, where $$a_{0/2} = 5.65/2 = 2.83 \text{ Å}.$$

The computer 22 can detect under a suitable programming software that the damping of the oscillation is so fast that the amplitude of the oscillation becomes substantially equal to noise level. Then, the computer 22 provides the above-described recovery time before the complete damping of the RHEED oscillation and thereafter starts the crystal growth again. As a result, the crystal growth can be continued infinitely (that is, until the sources are exhausted) while the number of grown mono-layers is digitally counted. Therefore, the thickness of the grown film can be measured in terms of the mono-layer unit and is equal to (the number of grown mono-layer) x (the thickness of the mono-layer).

Figure 10:
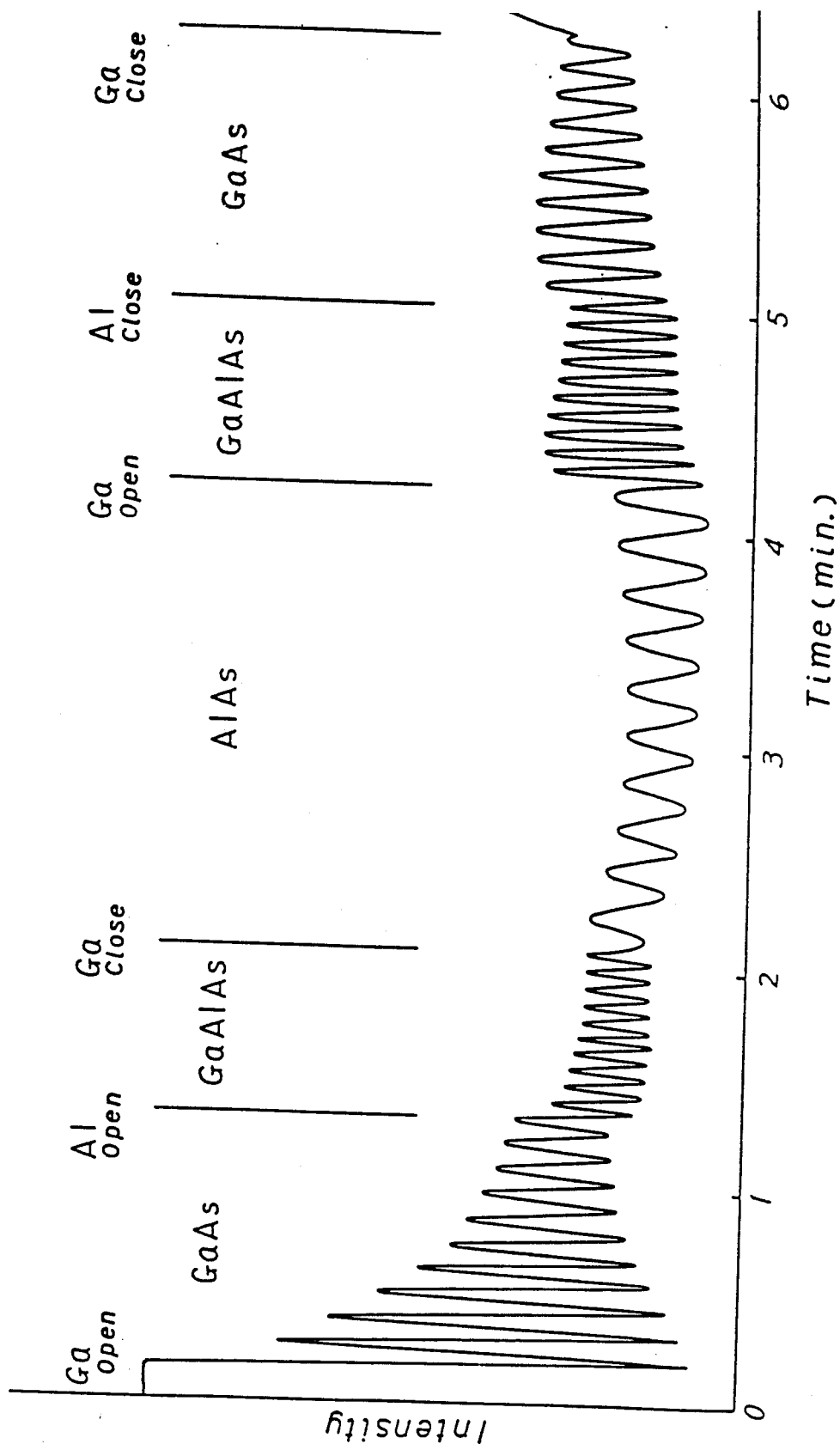
FIG. 10 is a waveform diagram illustrating the oscillation obtained when the Ga and Al shutters were alternately opened and closed.

FIG. 10 shows an example of the oscillation of the RHEED intensity when different crystals formed the heterojunction and a mixed crystal is grown.

In this example, first the Ga shutter was opened so that 10 GaAs mono-layers were grown. Thereafter, the Al shutter was opened while the Ga shutter remained open, so that ten AlGaAs mono-layers were grown. Next, the Ga shutter was closed, so that only 10 AlAs mono-layers were grown and then the Ga shutter was opened, so that 10 AlGaAs mono-layers were grown. Finally, 10 GaAs monolayers were grown. As a result, 50 mono-layers in total (about 142.5 Å in thickness) were grown.

As is clear from FIG. 10, one period of oscillation of the intensity of the RHEED pattern corresponds to one mono-layer, so that the composition ratio x of the mixed crystal $Al_xGa_{l-x}As$ can be directly determined from the frequency of the oscillations. That is, when f(GaAs) represents the oscillation frequency of GaAs and f(AlAs) represents the oscillation frequency of AlAs, the composition ratio $x_1$ is obtained from equation (1) and when f(AlGaAs) represents the oscillation frequency of $Al_xGa_{l-x}As$, the composition ratio $x_2$ is given by equation (2).

$$x_1 = \frac{f(AlAs)}{f(GaAs) + f(AlAs)} \quad (1)$$

$$x_2 = \frac{f(AlGaAs) - f(GaAs)}{f(AlGaAs)} \quad (2)$$

In principle, $x_1$ and $x_2$ obtained from equations (1) and (2), respectively, must be equal to each other. Equation (1) gives the Al composition ratio x of the mixed crystal $Al_xGa_{l-x}As$ when the oscillation frequencies of AlAs and GaAs are known and AlAs and GaAs are simultaneously grown. Equation (2) gives the concentration of Al when the oscillation frequencies of AlGaAs and GaAs are known and AlGaAs and GaAs are grown.

TABLE 1 shows the coincidence of equations (1) and (2) when the temperature of the Ga cell is maintained constant; that is, the amount of discharged Ga flux is maintained constant while the temperature of the Al cell is varied; that is, the amount of discharged Al flux is varied. It is seen from TABLE 1 that equations (1) and (2) are substantially equal to each other.

TABLE 1

| Al temperature (°C.) | Oscillation frequency (sec $^{-1}$) | | | Al mole fraction | |
|---|---|---|---|---|---|
| | AlAs | GaAs | Al$_x$Ga$_{1-x}$As | $x_1$ | $x_2$ |
| 1183 | 1.92 | 0.22 | 2.0 | 0.90 | 0.89 |
| 1142 | 1.11 | 0.22 | 1.16 | 0.83 | 0.81 |
| 1111 | 0.60 | 0.22 | 0.75 | 0.73 | 0.71 |
| 1182 | 0.33 | 0.22 | 0.51 | 0.60 | 0.57 |
| 1071 | 0.25 | 0.22 | 0.45 | 0.53 | 0.51 |
| 1051 | 0.16 | 0.22 | 0.37 | 0.42 | 0.41 |
| 1031 | 0.10 | 0.22 | 0.31 | 0.31 | 0.29 |
| 992 | 0.045 | 0.22 | 0.27 | 0.17 | 0.19 |
| 971 | 0.025 | 0.22 | 0.25 | 0.10 | 0.12 |
| 931 | 0.011 | 0.22 | 0.23 | 0.05 | 0.04 |

It is seen from TABLE 1 that in almost all the cases, the values of $x_1$ obtained from equation (1) are slightly higher than those of $x_2$ obtained from equation (2). The reason is as follows. When AlAs and GaAs are grown independently of each other, the oscillations of AlAs and GaAs will not continue for a long period of time and the fluxes supplied at the initial period of the crystal growth is varied as the lapse of time. That is, when the crystal growth is started, a large amount of flux is supplied, so that the crystal growth rate is high and the oscillation frequency is high. On the other hand, the oscillation of AlGaAs continues for a long period of time as compared with the crystal growth of sole GaAs, so that the oscillation continues even after the flux variation in the initial stage of the crystal growth has vanished. Therefore, when the number of oscillations of AlGaAs is calculated, the initial stage of the crystal growth can be ignored. To obtain the oscillation frequency of GaAs, the oscillation frequency of GaAs can be calculated from the oscillation of GaAs growth after the Al shutter is closed under the condition of the oscillation of AlGaAs growth. Therefore, the oscillation of GaAs does not include a high oscillation frequency part due to the flux variation caused during the initial stage of the crystal growth. As a result, the composition ratio $x_2$ obtained from equation (2) is a very accurate value.

The composition ratio $x_3$ can also be obtained from the following equation (3).

$$x_3 = \frac{f(AlAs)}{f(AlGaAs)} \quad (3)$$

In principle, all composition ratios $x_1$, $x_2$ and $x_3$ should be equal.

The average value $$x\left(= \frac{x_1 + x_2 + x_3}{3}\right)$$

is plausible as a correct composition ratio x, if $x_1$, $x_2$ and $x_3$ are slightly different from each other. In the case that there is a much difference between the values of $x_1$, $x_2$ and $x_3$, it is reasonable that $x_2$ is selected as the correct composition ratio x.

Therefore, the method of the present invention has an advantage that the composition ratio x can be determined during the crystal growth. The composition ratio x obtained according to the present invention is more accurate than that obtained by the prior art methods. It follows, therefore, that the mixed crystal which is grown with the composition ratio determined in accordance with the present invention can be used as a standard mixed crystal.

The left side of FIG. 11 illustrates the structure of the crystal (with the total number of 2,394 layers) in which one group of 100 AlAs mono-layers, three groups of 50 AlAs mono-layers, three groups of 20 AlAs mono-layers, three groups of 10 AlAs mono-layers, three groups of 5 AlAs mono-layers, three groups of 2 AlAs mono-layers, three groups of 1 AlAs mono-layer and one group of 130 AlAs mono-layers are separated from each other by a group of 100 GaAs mono-layers. The right side of FIG. 11 shows a TEM photograph of the cross section of the hetero-multi-layered crystal with a structure as shown in the left side schematic view. In this crystal, the number of monolayers was determined by the number of periods of the RHEED oscillation. Three lines formed by one AlAs mono-layer can be distinctly distinguished. The TEM photograph is at ×100000 and if this magnification is correct, the value of (the total number of periods of oscillation)×(the thickness-of one mono-layer)×(magnification) substantially coincides with the whole width on the photograph. It was obtained from the result that the thickness corresponding to one period of oscillation was 2.83 Å which was well equal to the value hitherto known. Thus, it can be concluded that one period of the RHEED pattern corresponds to one mono-layer.

FIG. 12 shows the oscillation waveform of the RHEED intensity when a group of three GaAs mono-layers and a group of three AlAs mono-layers were alternately grown to form the (GaAs)$_3$(AlAs)$_3$ superlattice.

When such a superlattice is grown, first the Al shutter is opened to grow three AlAs layers. Since the initial phase is so selected as to correspond to a peak, the crystal growth of AlAs is interrupted at a phase of a peak and the recovery time of five seconds is inserted. Three GaAs layers are grown in such a way that the initial phase corresponds to a peak and then the crystal growth is interrupted at a phase of a peak. Subsequently, the recovery time of five seconds is provided. These steps are repeated to grow the crystal under the control of the computer 22.

The controlling method of the crystal growth such as the present invention is referred to as "PLE" hereinafter in this specification. The PLE means Phase-Locked Epitaxy. Using PLE, the superlattice structure consisting of two AlAs mono-layers and two GaAs mono-layers was grown for 699 periods (2796 mono-layers) and then was subjected to the X-ray diffraction and Raman spectroscopic analyses. It was recognized that the grown crystal had a desired superlattice structure as expected.

Figure 13:
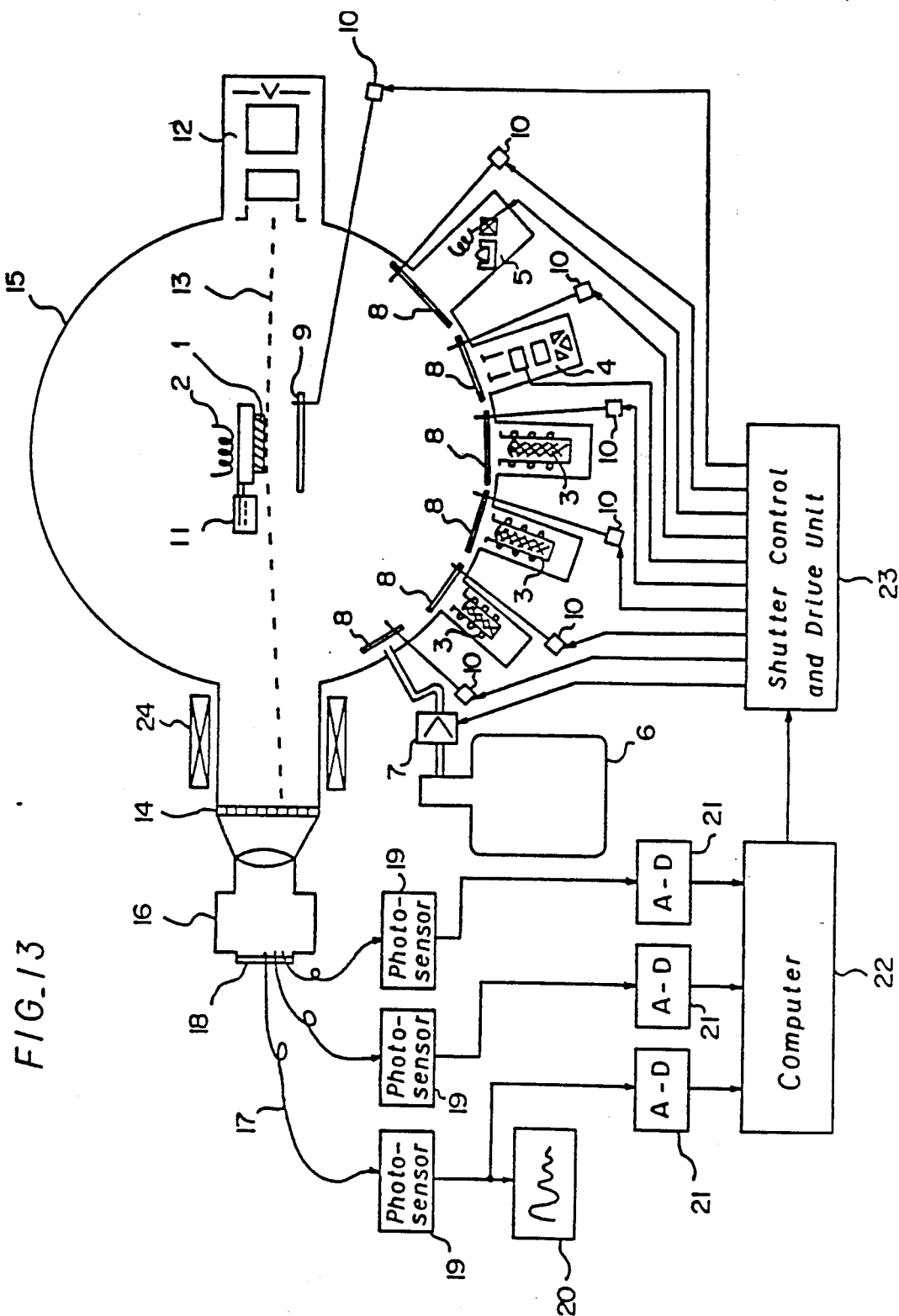
FIGS. 13 and 14 are schematic diagrams showing two embodiments of a crystal growth apparatus, used to carry out the present invention.

While in the apparatus shown in FIG. 5, only one set of the optical fiber 17, the photosensor 19 and the A-D converter is used, an apparatus in which more than two sets are used is shown in FIG. 13. Almost all the bright lines and spots on the RHEED pattern oscillate, even though slightly, when the crystal growth is started. Therefore, when more than two points on the RHEED pattern are observed to obtain an exact initial phase, so that the pattern of the oscillation is predicted to interrupt and resume the crystal growth, the computer is considerably heavily loaded, but the observation of more than two points is very important, because it becomes possible to control the thickness of a thin crystal film being grown with a high degree of accuracy and to determine the composition ratio of a mixed crystal with a high degree of accuracy.

FIG. 13 shows an apparatus which is used to attain the above-described capabilities.

In the embodiments as shown in FIGS. 5 and 13, a coil 24 for producing the alternating magnetic field is disposed adjacent to the RHEED screen 14 or between the substrate 1 and the screen 14, so that the diffracted electron beam is modulated at a frequency about ten times higher than the oscillation frequency of the RHEED intensity in order to observe the weak oscillation of the RHEED intensity. The output from the photosensor 19 is phase-detected, so that the weak oscillation of the RHEED pattern can be observed at a higher S/N ratio. As a consequence, high quality information can be applied to the computer 22.

Figure 14:
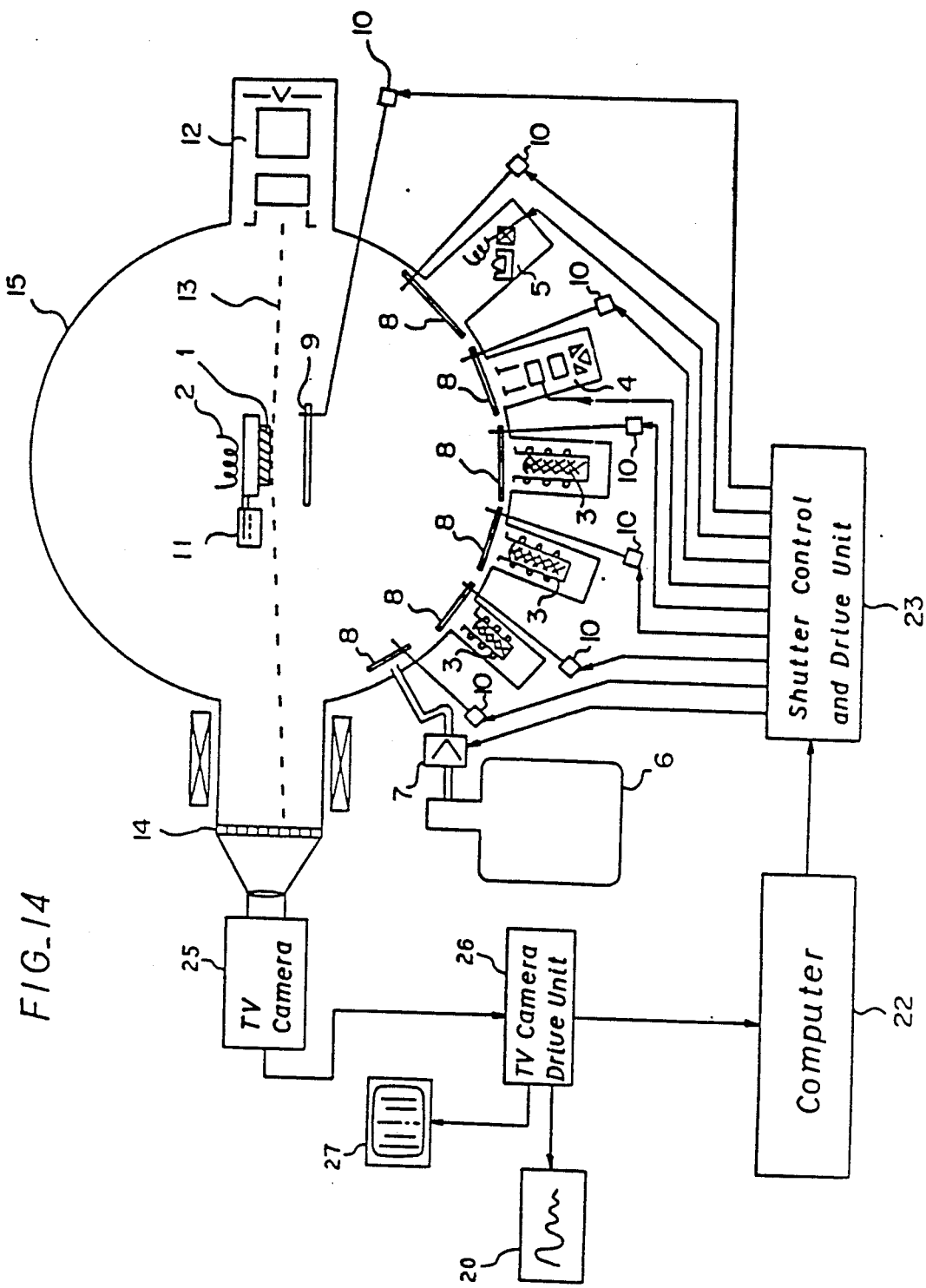

Furthermore, while in the apparatus as shown in FIG. 5, the system consisting of the camera lens 16, the optical fiber 17, the photosensor 19 and the A-D converter 21 is used, in the apparatus as shown in FIG. 14, a television camera 25, a television camera drive unit 26, a monitor television receiver 27 and a recorder 20 are provided alternatively. While the RHEED pattern picked up by the television camera 25 is displayed by the monitor 27, the intensity signals at any desired points, which are arbitarily selected, on the screen of the monitor 27 can be fed into the recorder 20 and the computer 22. In this case, instead of detecting an observation point on the RHEED pattern by displacing the X-Y stage 18 shown in FIG. 5, any desired observation point on the RHEED pattern displayed on the screen of the monitor 27 can be electrically selected by the television camera drive unit 26. Therefore, the operation is very simple. The crystal growth is started and interrupted in a manner substantially similar to that described above by the computer 22 and the shutter control and drive unit 23.

So far the present invention has been described in conjunction with the crystal growth of GaAs, AlAs and AlGaAs, but it is to be understood that the present invention may be equally applied to the control of the thickness of any grown crystal of any material whose RHEED intensity oscillates during the crystal growth and also can determine the composition ratio of a mixed crystal. For instance, in addition to the above-described compounds, it is known in the art that Ge, Si and $Ga_x In_{1-x}P$ also exhibit the oscillation of their RHEED intensities, so that the present invention can be also applied when these compounds are grown.

While in the foregoing explanation of the present invention only RHEED is used as electron beam diffraction, it should also be noted that electron beam to be used in the present invention is not limited to a high energy electron beam and that any type of electron beam, for example, low energy electron beam, can be utilized as far as diffraction pattern is obtained.

FIG. 26 shows an example of a crystal grown in accordance with PLE of the present invention and it is seen that the interface between the mono-layers is flat without fluctuation and that the thickness of the grown crystal is exactly controlled, compared with the interface shown in FIG. 4.

As described above, according to the present invention, in synchronism with the variations in intensity of electron beam diffraction pattern, the crystal growth is started and interrupted, so that the crystal growth can be controlled in terms of the thickness of the monolayer. As a result, the control of the thickness of the thin film can be carried out with an extremely high degree of accuracy. Furthermore, according to the present invention, when more than two compounds are simultaneously grown, the composition of the resulting mixed crystal can be exactly determined. In addition, even in the case of the heterojunction, the flatness of the interface can be controlled by the order of the mono-layer. As a result, the wavelength bands of the quantum well lasers or light emitting diodes can be narrowed and the quantum well lasers or light emitting diodes become highly reliable in operation. Furthermore, in the case of HEMTs, the operation speed can be considerably increased. In the case of superlattice devices, their characteristics can be stabilized.

In case of embodying the present invention by using a reflection high energy electron beam as an electron beam, the present inventors recognized and found a preferable embodiment, in which an electron beam is incident to the crystal surface from a particular azimuth direction so that the number of RHEED oscillation is remarkably increased. In this embodiment, a thin film having a relatively thick thickness can be measured at one time in order to control the film thickness.

Figure 15:
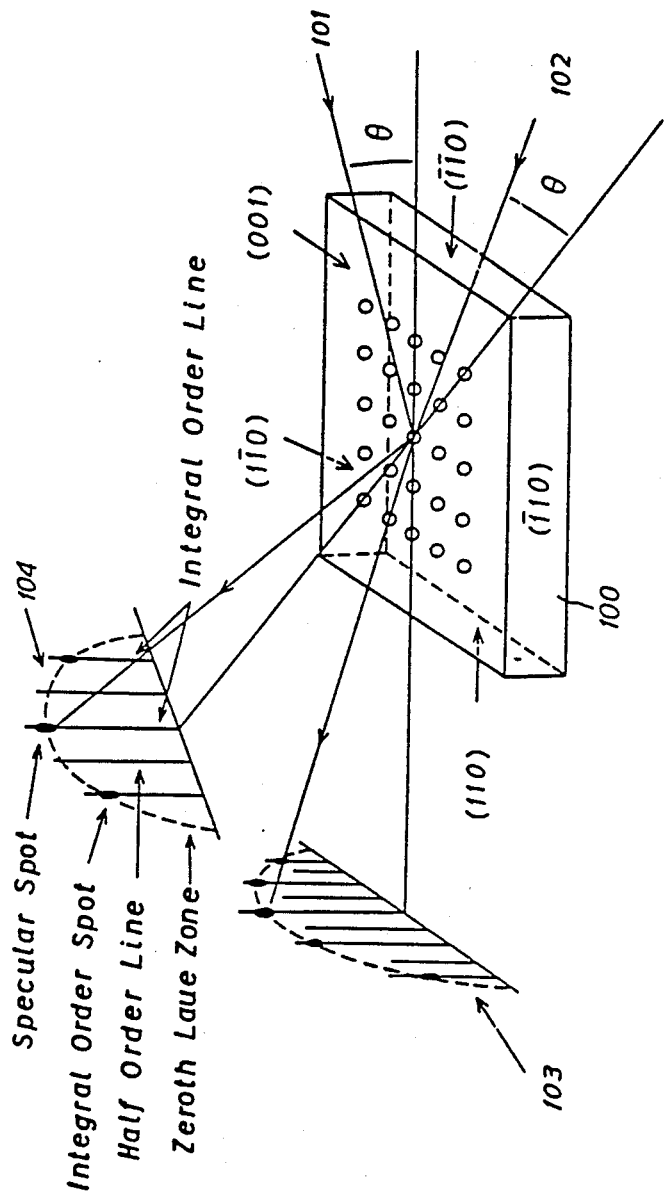
FIG. 15 is a schematic view showing the azimuth directions of incident electron beams and diffraction patterns obtained when a (001) GaAs substrate is used.

Referring to FIG. 15, for the sake of understanding this fact, the azimuth directions of incidence of electron beams and the diffraction patterns obtained by these electron beams when a (001) GaAs substrate 100 is used will be explained.

In the prior art crystal growth process under vacuum condition, when the surface crystal structure of a thin crystal film grown over a (001) plane of a semiconductor substrate and this semiconductor substrate are observed by the diffraction patterns of the electron beams from a reflection high energy electron diffraction apparatus, the electron beam 101 from the reflection high energy electron beam apparatus is generally directed in parallel with the [110] crystal azimuth direction of the semiconductor substrate or the thin crystal film. The reason is as follows. The diffraction pattern 103 obtained when the electron beam 101 is directed in the [110] azimuth direction is denser and brighter than the diffraction pattern 104 obtained when the electron beam 101 is directed in direction [100] azimuth. Furthermore, it is easy to intuitively understand the surface superlattice structure of the substrate 100 from the diffraction patter 103 in the direction [110] azimuth. Therefore, the oscillations of the intensities of the RHEED patterns so far reported were all observed from direction [110] azimuth.

On the other hand, according to the present invention, as will be described in detail hereinafter, direction [100] azimuth is used which makes 45° relative to direction [110] azimuth. Further, in the present invention, it is understood that direction [100] azimuth includes [1̄00], [010] and [010] azimuths.

Figure 16:
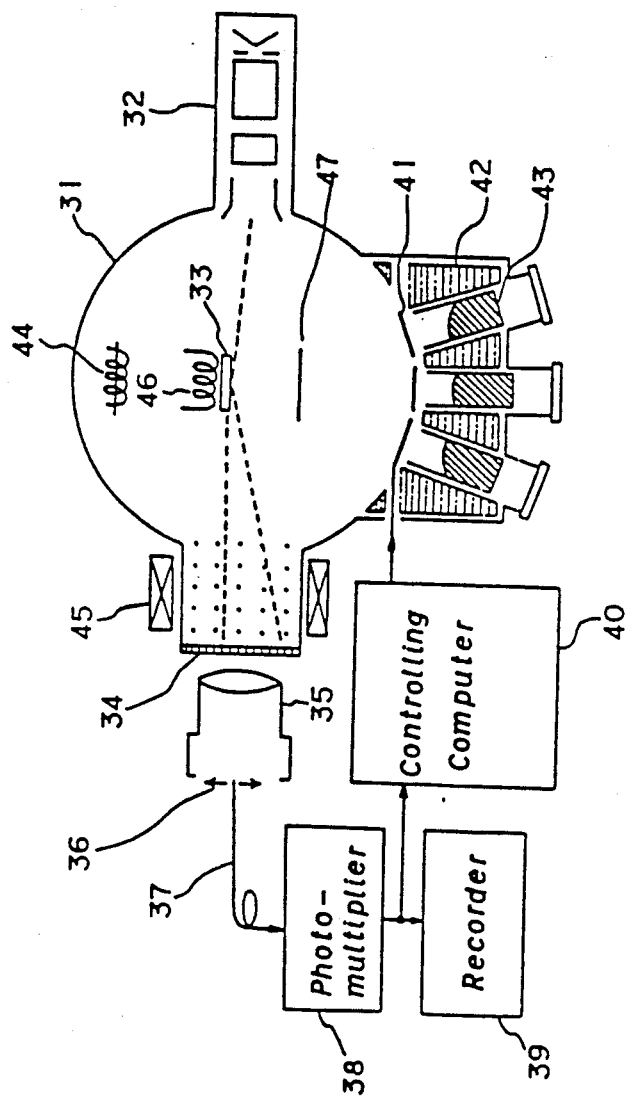
FIG. 16 is a schematic view showing a crystal growth apparatus used to carry out the present invention.

FIG. 16 is a schematic view showing a crystal growing apparatus used to carry out the present invention.

In FIG. 16, a vacuum crystal growing apparatus 31 has an electron gun 32 for reflection high energy electron diffraction. The electron beam from the electron gun 32 is reflected and diffracted by a semiconductor substrate 33, so that a diffraction pattern is displayed on a fluorescent screen 34. A coil 45 for generating a magnetic field is disposed immediately before the screen 34, so that the diffraction pattern displayed on the screen 34 can be scanned. The intensity of any desired spot of the diffraction pattern on the screen 34 is led through a camera lens 35 to an optical fiber 37 mounted upon an X-Y movable mechanism 36 and then to a photo-multiplier 38. The electrical output from the photo-multiplier 38 is applied to a recorder 39 and a controlling computer 40. Shutters 41 for vapor sources 43 are controlled by the computer 40. The vapor sources 43 are filled with Ga, Al, As, etc. which are heated at a high temperatures to produce the molecular beams. A thin crystal film is grown on the semiconductor substrate 32 by controlling the supply of these molecular beams by the shutters 41 and a shutter 47.

FIGS. 17A-17C show the intensity distribution of the diffraction pattern and the phase of the periodic oscillation of the intensity when the electron beam is incident in parallel with direction [110] azimuth.

FIG. 17A illustrates the diffraction pattern. The acceleration voltage was 40 kV and the angle of incidence was 14 mrad. In general, the oscillation at point a where the specular has the maximum brightness continues for a longer period of time, so that it is used for observation. In FIG. 17A, point b is angularly spaced apart from point a by 6 mrad on the integral order line and is opposite to point a with respect to bright point 0 of the direct beam.

FIG. 17B shows the diffraction intensity distribution adjacent to a-b of FIG. 17A, the solid line curve shows the intensity of the diffraction pattern prior to the thin film growth while the broken line curve shows the intensity of the diffraction pattern after the growth of a thin film has been started and then the oscillation of the intensity has been sufficiently damped.

FIG. 17C shows the oscillations at points a and b in FIG. 17A after the growth of a thin film has been started.

It is seen from FIGS. 17A-17C that the intensity at specular spot a of the diffraction pattern in direction [110] azimuth is not definitely isolated from the intensity of the integral order line which crosses a-b and becomes greater in the proximity of point a. As shown in FIG. 17C, the oscillation at specular spot a is out of phase by 180° relative to the phase of the amplitude of the integral order line indicated by b.

As described above, the luminance at specular point of the diffraction pattern in direction [110] azimuth is strong prior to the growth of the thin crystal film, but immediately after the growth of the thin crystal film has been started, the intensity of the integral order line having the amplitude of the opposite phase is increased. As a result, interference occurs, so that the oscillation at specular point is immediately damped. As a consequence, in the prior art, it was possible to observe only several tens times of oscillations. The integral order line is produced, because the step of the order of a monolayer is produced on the surface of the thin film in direction [110] azimuth during the thin crystal film growth. The integral order line cannot be avoided and is very distinctly observed in the diffraction pattern in direction [110] azimuth. As a result, it becomes imperative to obtain a diffraction pattern by directing the electron beam in the crystal direction or orientation in which the effect of the integral order line is substantially eliminated.

FIGS. 18A-18C show the intensity distribution and the phase of the oscillation at each point of the diffraction pattern obtained when the electron beam was directed in parallel with direction [100] azimuth of the (001) semiconductor substrate.

FIG. 18A illustrates the diffraction pattern when the angle of incidence was 9 mrad and a is the specular point; b is a point on the fundamental lattice diffraction line angularly spaced apart from point a by 6 mrad; and O represents the spot formed by the direct beam.

FIG. 18B shows the intensity distribution of the integral order pattern adjacent to line a-b in FIG. 18A. The solid line curve shows the intensity distribution prior to the thin crystal film growth, while the broken line curve shows the intensity distribution after the oscillation of the intensity of the diffraction pattern was sufficiently dampled after the growth of the thin crystal film has been started.

FIG. 18C shows the oscillations at points a and b.

It is seen from FIGS. 18A-18C that the intensity at specular point is sufficiently greater than the intensity of the integral order line passing through the specular point and that their oscillation phases are not opposite to each other. From this fact, it is further seen that the oscillation at specular point is free from the influence due to the interference of the integral order line.

FIGS. 19A-19C show the intensity distribution and the phase of the oscillation of the diffraction pattern when the electron beam was diffracted in direction [100] azimuth and the angle of incidence was about 42 mrad.

FIG. 19A illustrates the reflected line image and a is the specular point; b is a point on the integral order line passing through point a and is angularly spaced apart from point a by about 4 mrad; and O represents the direct beam spot.

FIG. 19B shows the intensity distribution of the integral order line adjacent to line a-b and the solid line curve shows the intensity distribution prior to the thin crystal film growth, while the broken line curve shows the intensity distribution after the thin crystal film growth has been started.

FIG. 19C shows the oscillations of the intensity at points a and b, respectively.

It is seen from FIGS. 19A-19C that at the above-described angle of incidence, the phase of the oscillation at specular point a is out of phase by about $4/5\pi$ relative to the phase of the oscillation at the point on the integral order line b and that, as shown in FIG. 19B, the intensity at the specular point is isolated and is almost free from the interference due to the integral order line.

FIG. 20 illustrates that oscillation of the RHEED intensity at specular point a measured when $Al_xGa_{1-x}As$ (X=0.61) was growing on the (001) substrate under the conditions shown in FIGS. 18A-18C. It is seen that the amplitude is rapidly damped at he beginning and then quite gradually damped, so that more than 400 times of oscillations are observed. The oscillations, the number of which is more than ten times longer than the number of oscillations observed by the prior art method in direction [110] azimuth are observed. It is considered that because of the substantial elimination of adverse effects of the integral order line, the oscillations are not damped for a long period of time.

In addition to direction [100] azimuth, the present invention may be equally applied to directions [120] and [130] azimuths.

FIG. 21 shows the oscillation of the RHEED intensity at the specular point obtained when the diffraction pattern was observed in crystal axis direction [120] azimuth (including [210], [1̄20], [2̄10], [21̄0], [12̄0] and [2̄1̄0] azimuths) while a thin GaAs film was epitaxially grown on the (100) GaAs substrate. It is seen from FIG. 21 that the oscillations continue for a long period time.

Figure 22:
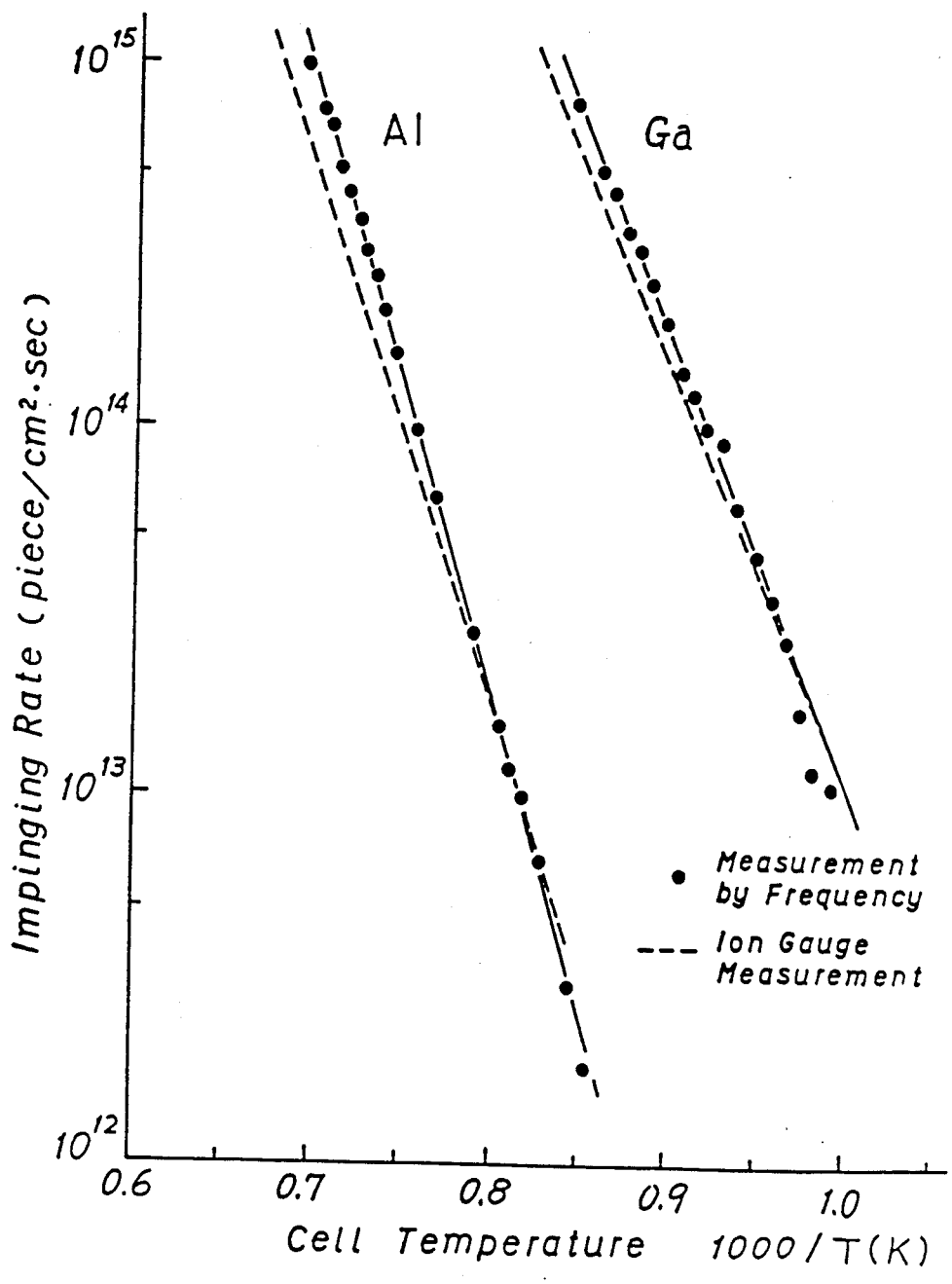
FIG. 22 is a characteristic diagram illustrating the impinging rates of Al and Ga to the substrates obtained from the periods of oscillation in the direction [120] azimuth obtained when GaAs was grown on the (001) GaAs substrate and the impinging rates measured by a prior art method using an ion gauge for the sake of comparison.

FIG. 22 shows the impinging rates of Al and Ga flux into the substrate obtained from the observation of such long and stable oscillations as described above. In the experiments, the impinging rates were obtained from the number of oscillations of the intensity of the diffraction lines of AlAs and GaAs when AlAs and GaAs were grown while changing the Al and Ga cell temperatures. It is seen that the impinging rates were measured with an extremely high degree of accuracy.

Figure 23:
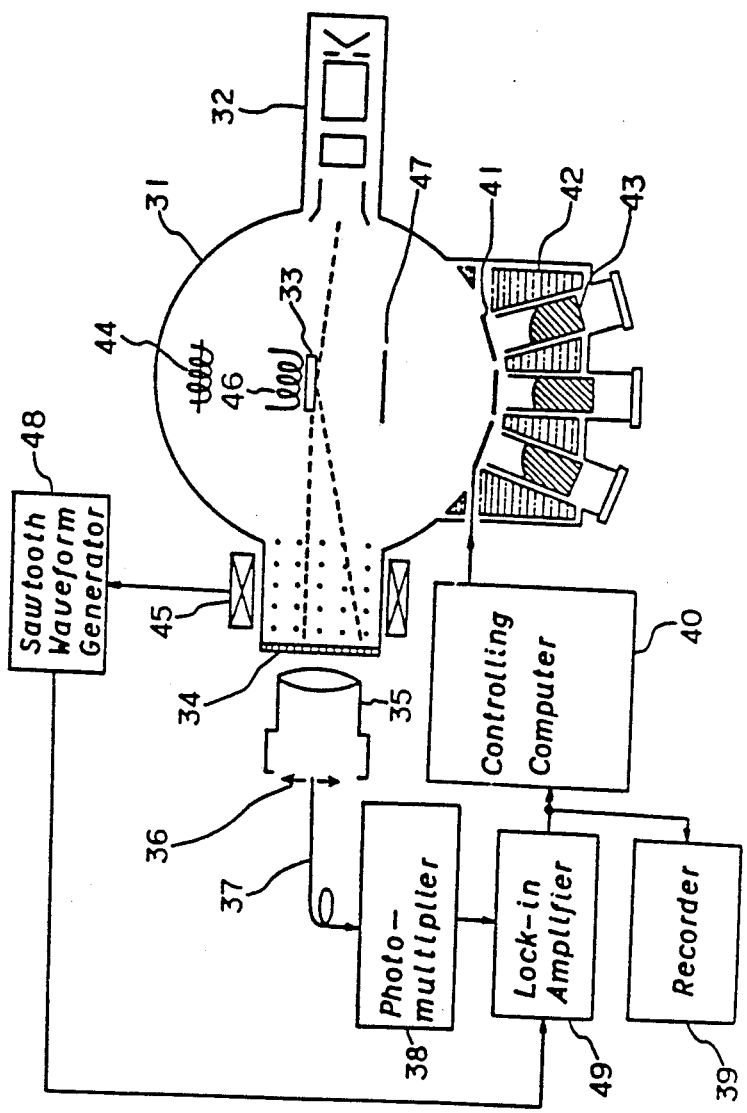
FIG. 23 is a schematic view showing another apparatus used to carry out the present invention.

FIG. 23 shows a further embodiment of the present invention embodying the observation of the oscillations for a long period of time. In this embodiment, the diffracted electron beam from a semiconductor substrate 33 is deflected by generating the sawtooth waveform magnetic field with a high frequency about ten times higher than the oscillation frequency of the RHEED intensity by a sawtooth voltage generator 48, so that the diffraction pattern on the fluorescent screen 34 is deflected periodically. The deflected diffraction pattern is enlarged by a camera lens 35 and then is led through the optical fiber 37 mounted on the X-Y drive mechanism 36 to the photo-multiplier 38 at the other end of the optical fiber 37. The output of the photo-multiplier 38 is applied to a lock-in amplifier 49, while a part of the sawtooth waveform output signal from the sawtooth waveform voltage generator 48 is simultaneously applied as a reference signal to the lock-in amplifier 49. When the diffraction pattern is modulated in the manner described above and the signal from the photo-multiplier 38 is phase-sensitively detected by the lock-in amplifier 49, the oscillation of the intensity of the diffraction pattern shielded by noise can be observed for a further long period of time.

In a modification of the above-described embodiment, instead of deflecting the diffracted electron beam by applying the sawtooth waveform voltage to the coil 45, the sawtooth waveform voltage and current are superposed to the acceleration voltage, the emission current and the deflection voltage of the electron gun 33 of the RHEED apparatus so as to deflect the diffraction pattern on the screen 34. The output from the photo-multiplier 38 is applied to the lock-in amplifier 49, while a part of the sawtooth waveform voltage or current superposed to the acceleration voltage, the emission current and the deflection voltage of the electron gun 32 is simultaneously applied as a reference signal to the lock-in amplifier 49, whereby S/N ratio can be improved.

Figure 24:
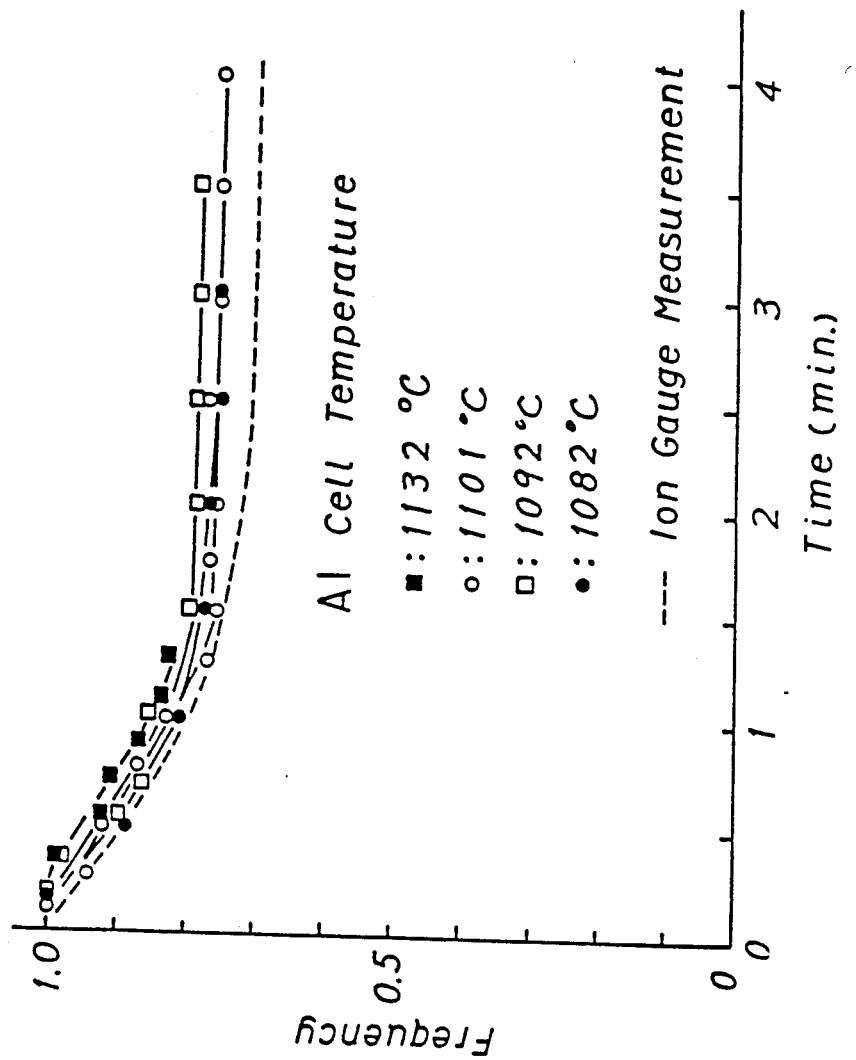
FIG. 24 is a characteristic diagram illustrating the variation in time of frequency of the RHEED oscillation obtained when $Al_xGa_{1-x}As$ was grown at various Al cell temperatures.

FIG. 24 shows the variations in oscillation frequency of the diffraction line intensity obtained when the crystal growth of $Al_xGa_{1-x}As$ was started by opening the Ga and Al shutters under the same experimental conditions as shown in TABLE 1. It is seen that the oscillation frequency is gradually decreased immediately after the crystal growth and remains constant after about 90 seconds. This means that the Ga and Al cell temperatures dropped immediately after the shutters were opened, so that the fluxes were decreased and consequently the oscillation frequency became a constant value after about 90 seconds. These results are substantially equal to the results (indicated by the broken line in FIG. 24) obtained by the conventional measurement of vapor pressure by the ion gauge 44. When the oscillation of the diffraction intensity can be observed for a long period of time as described above, the variations in time of the flux impinging on the substrate can be observed with a higher degree of accuracy.

Figure 25:
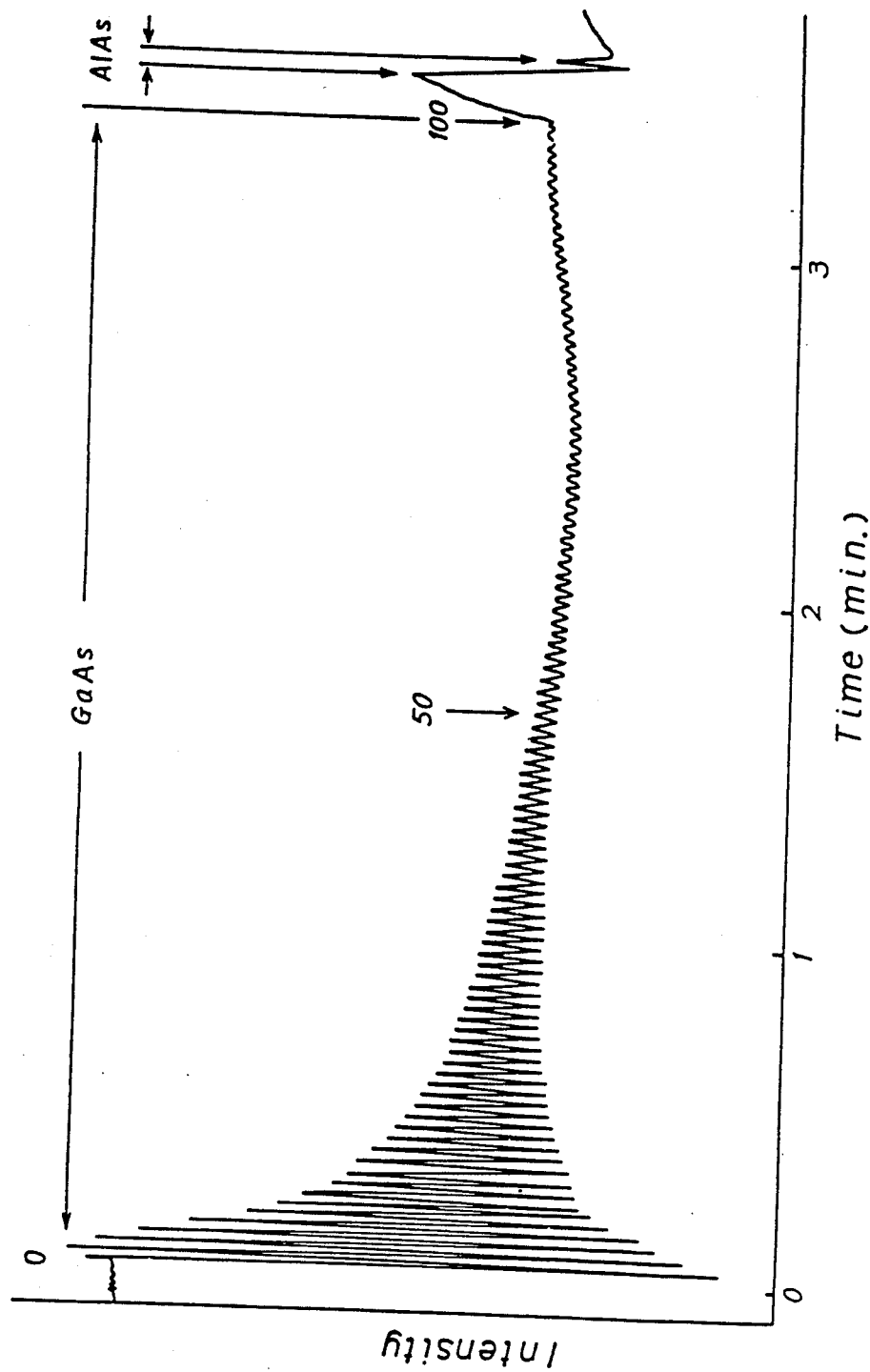
FIG. 25 is a waveform diagram illustrating the RHEED oscillations obtained when 100 GaAs mono-layers and one AlAs mono-layer were grown.

FIG. 25 shows the results of further embodiment of the present invention. In the experiments of PLE, 100 periods (that is, 100 mono-layers) of the thin GaAs film were grown, while counting the oscillation of the intensity of the diffraction pattern and then the Ga shutter was closed so that the flatness of the surface was recovered for a short period of time. Thereafter, the Al shutter was opened so that one period (that is, one monolayer) of AlAs was grown. The oscillation of the RHEED intensity thus observed is shown in FIG. 25.

FIG. 11 shows on the left side the structure of the crystal grown by the PLE. Each GaAs layer consists of 100 mono-layers.

As described above, according to the present invention, the oscillations of the intensity of the RHEED pattern can be observed more than 400 times, so that the thickness of the grown thin crystal film can be measured and controlled with an accuracy higher than 1000 Å in terms of the mono-layer. Therefore, it is possible to obtain the impinging rate and variation of the flux and the composition ratio of a mixed compound, so that the present invention provides a very effective technique for the growth of crystals of devices such as superlattice devices, high electron mobility transistors, quantum well lasers and the like in which the film thickness must be controlled in terms of the mono-layer. Especially, the present invention is most suitable to the crystal growth controlling method in which the oscillation is analyzed by a computer in order to control thickness of films.

What is claimed is:

1. A method for determining the composition ratio of a mixed crystal including at least two kinds of crystals being grown in a vacuum atmosphere, comprising the steps of:

generating an electron beam in said vacuum atmosphere;

directing said electron beam thus generated to said mixed crystal to obtain a diffraction pattern of each of said crystals constituting said mixed crystal being grown, wherein said crystal is a semiconductor crystal having a (001) plane and said electron beam is incident to said (001) plane in the (100), (120) or (130) azimuth direction;

detecting variations with time of the oscillations of the intensity of said diffraction patterns thus obtained;

obtaining the frequency of the oscillations for each of said crystals constituting said mixed crystal and the frequency of the oscillations of said mixed crystal from said variations thus detected; and calculating the composition ratio of said mixed crystal from the ratio among said obtained frequencies.

2. A method for determining the composition ratio of a mixed crystal as claimed in claim 1, wherein said electron beam is generated and diffracted by a reflection electron beam diffraction apparatus.

3. A method for determining the composition ratio of a mixed crystal as claimed in claim 1, wherein said (100) azimuth direction includes the ($\overline{1}$00, 0$\overline{1}$0 and (0$\overline{1}$0) azimuth directions.

4. A method for determining the composition ratio of a mixed crystal as claimed in claim 1, further comprising modulating said diffraction patterns by a frequency about ten times higher than the frequency of said oscillations.

5. A method for determining the composition ratio of a mixed crystal as defined in claim 6 wherein said mixed crystal is a ternary III-V alloy formed of two binary III-V compounds having a common group V element; and wherein said ratio used in said step of calculating is equal to at least one of the following ratios:

(a) the ratio of the frequency of one of said two binary III-V compounds to the sum of the frequencies of the two binary III-V compounds;

(b) the ratio of the difference between the frequency of the ternary III-V alloy and the frequency of one of the two binary III-V compounds to the frequency of the ternary III-V alloy; and (c) the ratio of the frequency of one of said binary III-V compounds to the frequency of the ternary III-V alloy.

6. A method as defined in claim 5 further comprising: calculating each of said ratios (a), (b) and (c); and if the difference between the three ratios is small, calculating the average of said ratios (a), (b) and (c) and using the average ratio value as the composition ratio.

7. A method as defined in claim 5 further comprising: calculating each of said ratios (a), (b) and (c); and if there is much difference between the three ratios, using said ratio (b) as the composition ratio.

8. A method as defined in claim 5 wherein during growth of the mixed crystal initially a first layer of one of the binary III-V compounds is grown, followed by the growth of a second layer of the ternary III-V compound without changing the source conditions for the elements of the one binary III-V compound while additionally supplying the Group III element of the other of the two binary III-V compounds, and subsequently by the growth of a third layer of the other of the binary III-V compounds by interrupting the source for the Group III element of said one of the two binary III-V compounds without changing the sources of the two other elements of the ternary III-V alloy, each of said first, second and third layers comprising a plurality of mono-layers; and wherein said other of said two binary III-V compounds is used in said step of calculating ratios (a) and (c) and is the compound of said third layer, and said one of said two binary III-V compounds is used in the step of calculating ratio (b) and is the compound of said first layer.

9. A method for determining the composition ratio of a mixed crystal as defined in claim 1 wherein said mixed crystal is a ternary III-V alloy formed of two binary III-V compounds having a common Group V element; wherein during growth of the mixed crystal initially a first layer of one of the binary III-V compounds is grown, followed by the growth of a second layer of the ternary III-V compound without changing the source conditions for the elements of the one binary III-V compound while additionally supplying the Group III element of the other of the two binary III-V compounds and subsequently by the growth of a third layer of the other of the binary III-V compounds by interrupting the source for the Group III element of said one of the two binary III-V compounds without changing the sources of the two other elements of the ternary III-V alloy, each of said first, second and third layers comprising a plurality of mono-layers; and wherein said ratio used in said step of calculating is equal to the ratio of the difference between the frequency of the ternary III-V alloy and the frequency of the binary compound of said first layer to the frequency of the ternary III-V alloy.

* * * * *